United States Patent
Okishima

(10) Patent No.: US 9,368,372 B1
(45) Date of Patent: Jun. 14, 2016

(54) METHOD FOR MANUFACTURING SEMICONDUCTOR DEVICE

(71) Applicant: Renesas Electronics Corporation, Koutou-ku, Tokyo (JP)

(72) Inventor: Kazuhiko Okishima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/966,057

(22) Filed: Dec. 11, 2015

(30) Foreign Application Priority Data

Jan. 9, 2015 (JP) .................................. 2015-003553

(51) Int. Cl.
*H01R 43/00* (2006.01)
*H01L 21/48* (2006.01)
*H01L 25/00* (2006.01)

(52) U.S. Cl.
CPC ........ *H01L 21/4842* (2013.01); *H01L 21/4825* (2013.01); *H01L 25/50* (2013.01)

(58) Field of Classification Search
CPC ... H01L 21/76882; B23K 35/00; H01R 43/00
See application file for complete search history.

(56) References Cited

U.S. PATENT DOCUMENTS

| 4,927,069 | A | 5/1990 | Ushikubo et al. |
| 8,022,554 | B2 * | 9/2011 | Gupta et al. ........ B81C 1/00301 257/666 |

FOREIGN PATENT DOCUMENTS

| JP | H6-82697 B2 | 10/1994 |
| JP | 2000-349099 A | 12/2000 |
| JP | 2013-197146 A | 9/2013 |

* cited by examiner

*Primary Examiner* — Mohammad Choudhry
(74) *Attorney, Agent, or Firm* — Shapiro, Gabor and Rosenberger, PLLC

(57) ABSTRACT

It includes the step of pressing a correcting tool against the main surface of a semiconductor chip while a solder material coated over a die pad is in a molten state and letting the solder material harden and the step of releasing the correcting tool from the chip and mounting the chip over the die pad. The correcting tool includes a first part having a first surface as a surface along the support surface of a support member for supporting the die pad and a second part having a second surface intersecting with the first surface. In the chip inclination correction process, the solder material is hardened while the first surface of the correcting tool is pressed against the upper surface of the chip and the second part of the correcting tool is pressed against the lead frame.

12 Claims, 20 Drawing Sheets

METHOD FOR MANUFACTURING SEMICONDUCTOR DEVICE

CROSS-REFERENCE TO RELATED APPLICATIONS

The disclosure of Japanese Patent Application No. 2015-003553 filed on Jan. 9, 2015 including the specification, drawings and abstract is incorporated herein by reference in its entirety.

BACKGROUND

The present invention relates to a method for manufacturing a semiconductor device and more particularly to technology for a semiconductor device in which a semiconductor chip is mounted over a chip mounting area through a solder material (jointing material).

For a semiconductor device which uses a solder material as a die bonding material for bonding a semiconductor chip, in the die bonding step in the assembly process a lead frame is put and heated in a high-temperature stage with a temperature in excess of the melting point of the solder material and the solder material is supplied to the chip mounting area of the lead frame and melted.

Then, a semiconductor chip is placed over the molten solder material and a prescribed die bond weight is applied to the semiconductor chip. The molten solder material is released and cooled and thereby solidified to bond the semiconductor chip.

Techniques for mounting a semiconductor chip or semiconductor element over a lead frame or substrate using a tool are disclosed, for example, in Japanese Examined Patent Application Publication Hei 6 (1994)-82697, Japanese Unexamined Patent Application Publication No. 2000-34909, and Japanese Unexamined Patent Application Publication No. 2013-197146.

SUMMARY

In the above process of assembling a semiconductor device, the amount of solder material under the semiconductor chip varies according to fluctuations in the wettability of the solder material to the chip mounting area of the lead frame or the semiconductor chip, or fluctuations in the solder material supply position or fluctuations in the chip mounting position, causing the semiconductor chip to be mounted in an inclined manner in its thickness direction.

If the semiconductor chip is mounted in an inclined manner, the problem arises that the electric characteristics, heat radiation characteristics, wire bondability, and impact resistance fluctuate considerably, leading to quality instability and decline in the reliability of the semiconductor device.

The above and further objects and novel features of the invention will more fully appear from the following detailed description in this specification and the accompanying drawings.

According to one aspect of the present invention, there is provided a method for manufacturing a semiconductor device which includes the steps of: (a) coating a chip mounting area of a lead frame with a jointing material; (b) placing a semiconductor chip over the jointing material; (c) pressing a tool against the semiconductor chip with the jointing material in a molten state and then letting the jointing material harden; and (d) releasing the tool from the semiconductor chip and mounting the semiconductor chip over the chip mounting area. The tool includes a first part having a first surface as a surface along the support surface of a support member for supporting the chip mounting area and a second part having a second surface intersecting with the first surface. In the step (c), while the first surface of the first part of the tool is pressed against the upper surface of the semiconductor chip and the second part of the tool is pressed against the lead frame, the jointing material is hardened.

According to a second aspect of the present invention, there is provided a method for manufacturing a semiconductor device which includes the steps of: (a) providing an assembly with a semiconductor chip placed over a chip mounting area of a lead frame through a solder paste and (b) passing the assembly through a reflow furnace with a tool pressed against an upper surface of the semiconductor chip to melt the solder paste. It further includes the steps of: (c) taking the assembly out of the reflow furnace and letting the solder paste harden and (d) releasing the tool from the semiconductor chip and mounting the semiconductor chip over the chip mounting area through a solder material. The tool includes a first part having a first surface as a surface along the support surface of a support member for supporting the chip mounting area and a second part having a second surface intersecting with the first surface. In the step (b), while the first surface of the first part of the tool is pressed against the upper surface of the semiconductor chip and the second part of the tool is pressed against the lead frame, the solder paste is hardened.

According to the present invention, the reliability of the semiconductor device is improved.

DETAILED DESCRIPTION

Figure 1:
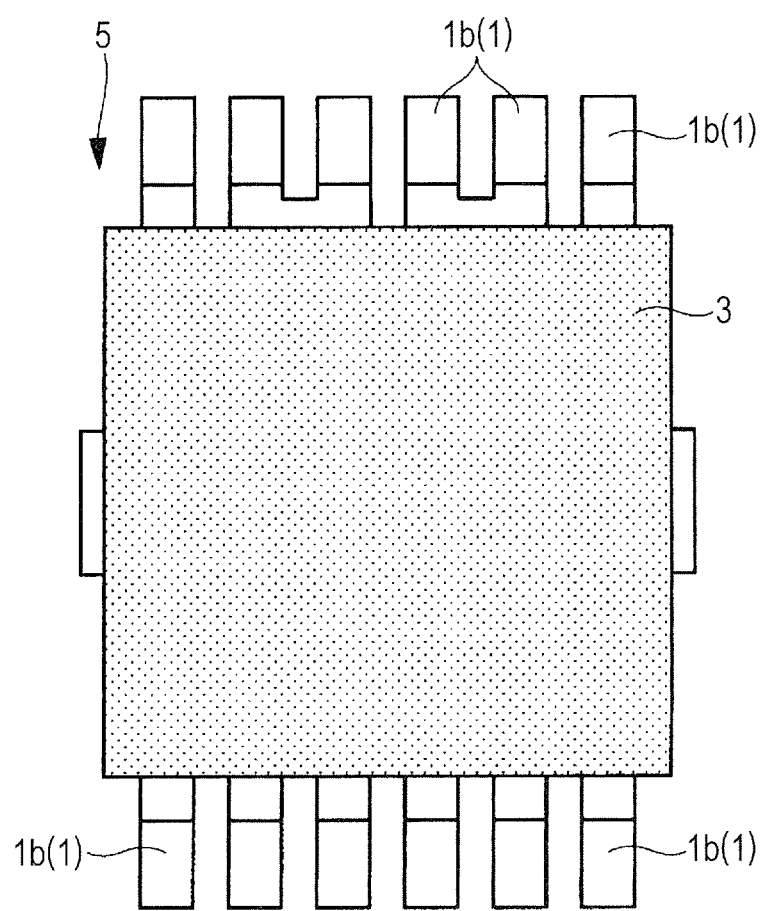
FIG. 1 is a plan view showing an example of the structure of a semiconductor device according to a first embodiment of the invention.

As for the preferred embodiments of the invention as described below, basically the same or similar elements or matters will not be repeatedly described except when necessary.

The preferred embodiments of the present invention may be described in different sections or separately as necessary or for the sake of convenience, but the embodiments described as such are not irrelevant to each other unless otherwise expressly stated. One embodiment may be, in whole or in part, a modified, detailed or supplementary form of another.

As for the preferred embodiments as described below, when numerical information for an element (the number of pieces, numerical value, quantity, range, etc.) is indicated by a specific number, it is not limited to the specific number unless otherwise specified or theoretically limited to that number; it may be larger or smaller than the specific number.

In the preferred embodiments as described below, constituent elements (including constituent steps) are not necessarily essential unless otherwise specified or theoretically essential.

In the preferred embodiments as described below, when an element is described, it is obvious that the expression "comprising A", "comprised of A", "having A", or "including A" does not exclude another element unless exclusion of another element is expressly stated. Similarly, in the preferred embodiments as described below, when a specific form or positional relation is indicated for an element, it should be interpreted to include a form or positional relation which is virtually equivalent or similar to the specific form or positional relation unless otherwise specified or theoretically limited to the specific form or positional relation. The same is true for the above numerical values and ranges.

Next, the preferred embodiments will be described in detail referring to the accompanying drawings. In all the drawings that illustrate the preferred embodiments, members with like functions are designated by like reference numerals and repeated descriptions thereof are omitted. For easy understanding, hatching may be used even in a plan view.

First Embodiment

Figure 2:
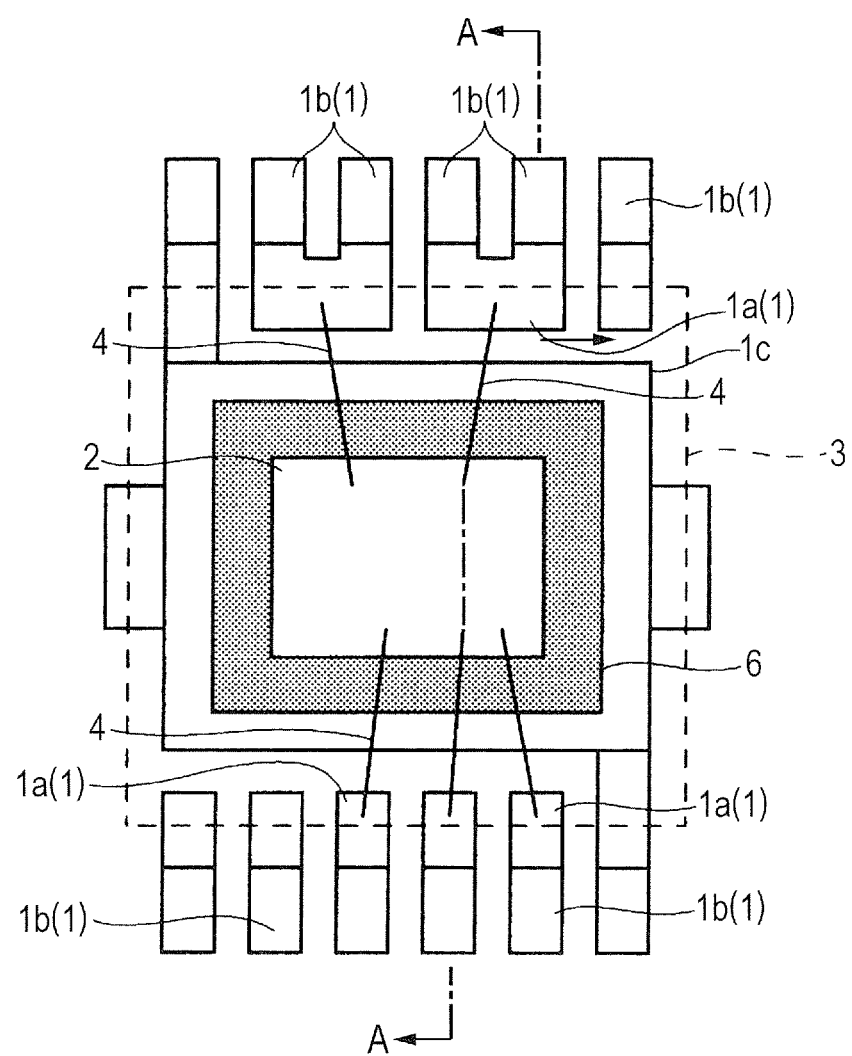
FIG. 2 is a plan view showing the internal structure of the semiconductor device shown in FIG. 1 as seen through a sealing member.

FIG. 1 is a plan view showing an example of the structure of a semiconductor device according to a first embodiment; FIG. 2 is a plan view showing the internal structure of the semiconductor device shown in FIG. 1 as seen through a sealing member; and FIG. 3 is a sectional view showing an example of the cross section taken along the line A-A in FIG. 2.

<Semiconductor Device>

Figure 3:
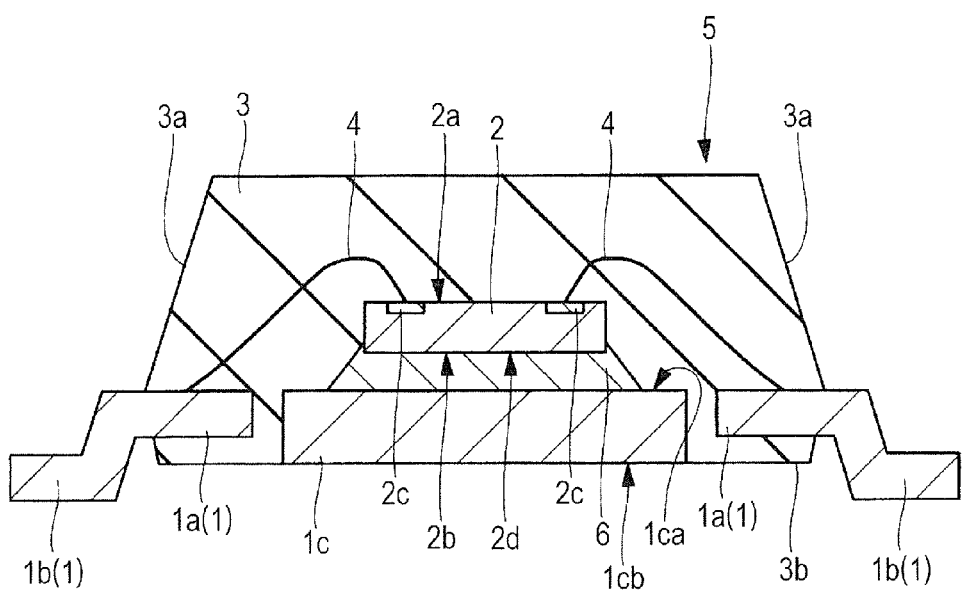
FIG. 3 is a sectional view showing an example of the cross section taken along the line A-A in FIG. 2.

The semiconductor device according to the first embodiment as shown in FIGS. 1 to 3 is a semiconductor package 5 which seals a semiconductor chip (also called a pellet) 2 and includes a sealing member 3 of insulating resin, and a plurality of leads 1 located inside and outside of the sealing member 5. Each of the leads 1 includes an inner leads part 1a covered by the sealing member 3 and an outer lead part 1b exposed (protruding) outside of the sealing member 3. Each of the outer lead parts 1b is an external coupling terminal (external terminal) of the semiconductor device.

In the semiconductor package 5 according to the first embodiment, as shown in FIGS. 1 and 3, a plurality of outer lead parts 1b protrude from each of a pair of side faces 3a opposite to each other among a plurality of side faces 3a of the sealing member 3.

As shown in FIG. 3, the lower surface 1cb of a plate-like die pad (also called a chip mounting area, island, header, or tab) 1c which supports the semiconductor chip 2 through its upper surface (chip mounting surface) 1ca is exposed from the lower surface 3b of the sealing member 3. That is, the semiconductor package 5 according to the first embodiment is a surface-mount semiconductor device.

The first embodiment will be described below by taking a power transistor (power device) as an example of the semiconductor package 5 with the above structure. The power transistor incorporates a semiconductor chip 2 in which a field-effect transistor including a drain (D) electrode, source (S) electrode, and gate (G) electrode is formed.

Therefore, an electrode (drain electrode) is formed on the back surface 2b of the semiconductor chip 2 and the semiconductor chip 2 generates a lot of heat. Thus, a solder material (jointing material) 6 is used as a die bonding material and the back surface 2b of the semiconductor chip 2 functions as a heat radiation path. In other words, the semiconductor chip 2 is mounted over the die pad 1c through the solder material 6 and the lower surface 1cb of the die pad 1c is exposed from the lower surface 3b of the sealing member 3 so that heat is radiated from the die pad 1c through the solder material 6.

Next, the structure of the semiconductor package 5 will be described in detail. As shown in FIG. 3, the semiconductor package 5 includes a die pad 1c having an upper surface 1ca and a lower surface 1cb opposite to the upper surface 1ca, and a semiconductor chip 2 mounted over the upper surface 1ca of the die pad 1c through the solder material 6 as the die bonding material. The semiconductor chip 2 has a main surface (upper surface) 2a, a plurality of electrode pads (bonding electrodes, bonding pads) 2c formed on the main surface 2a, and a back surface 2b opposite to the main surface 2a, in which the back surface 2b lies over the die pad 1c in a way to face the upper surface 1ca of the die pad 1c. The back surface 2b of the semiconductor chip 2 is also an electrode pad (bonding electrode, bonding pad) 2d which functions as a drain electrode.

As shown in FIGS. 2 and 3, the electrode pads 2c in the main surface 2a of the semiconductor chip 2 are electrically coupled to the inner lead parts 1a of the leads 1 through a plurality of wires (conductive members) 4.

The electrode pads 2c formed in the main surface 2a of the semiconductor chip 2 include a source electrode and a gate electrode.

The sealing member 3, which is formed so as to expose the lower surface 1cb of the die pad 1c from the lower surface 3b of the sealing member 3, seals part of the die pad 1c (the upper surface 1ca as shown in FIG. 3), the inner lead parts 1a, the semiconductor chip 2, and the wires 4.

Each of the outer lead parts 1b is integrally formed with an inner lead part 1a.

The die pad 1c and the leads 1 including the inner lead parts 1a and outer lead parts 1b are made of, for example, a Cu alloy mainly composed of Cu (copper). The die bonding material is a solder material 6. Preferably, the solder material 6 is a lead (Pb)-free solder which uses, for example, tin (Sn) or the like. Instead, it may be Sn—Pb solder or the like.

The wires 4 are made of, for example, Al (aluminum), Cu or the like. The sealing member 3 is made of, for example, thermosetting epoxy resin. The materials of these members are not limited to the above materials.

<Method for Manufacturing a Semiconductor Device>

Figure 4:
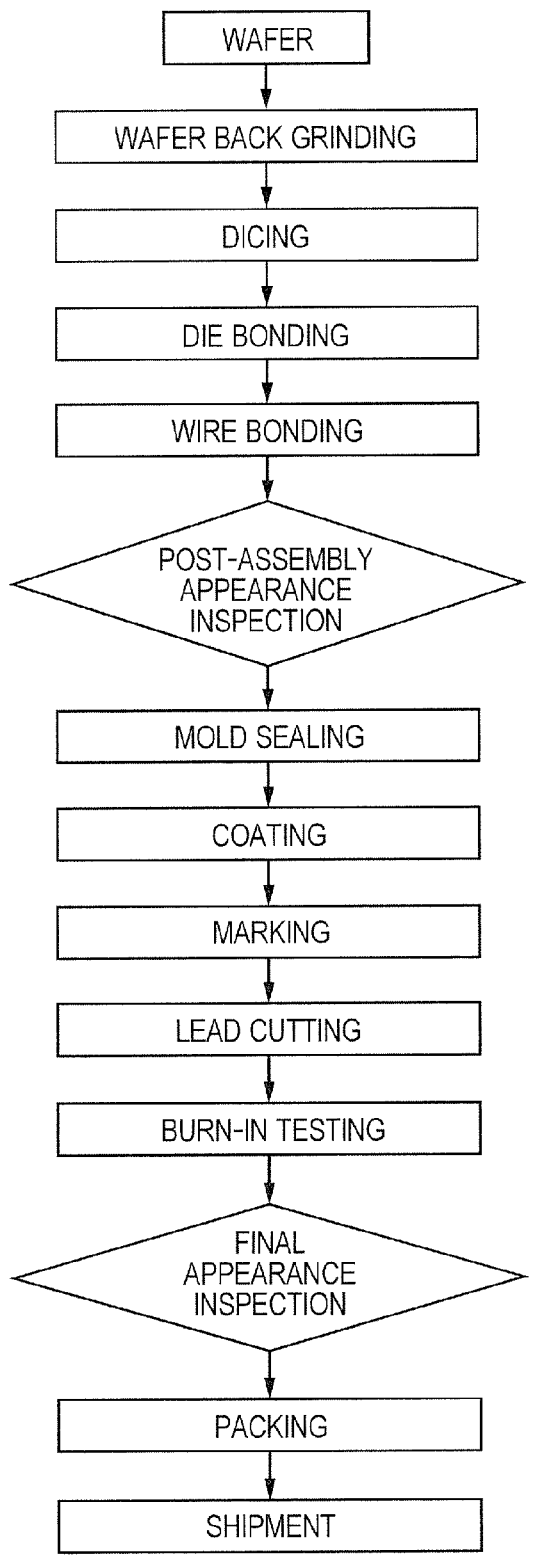
FIG. 4 is a flowchart showing an example of the sequence of assembling the semiconductor device shown in FIG. 1.
Figure 5:
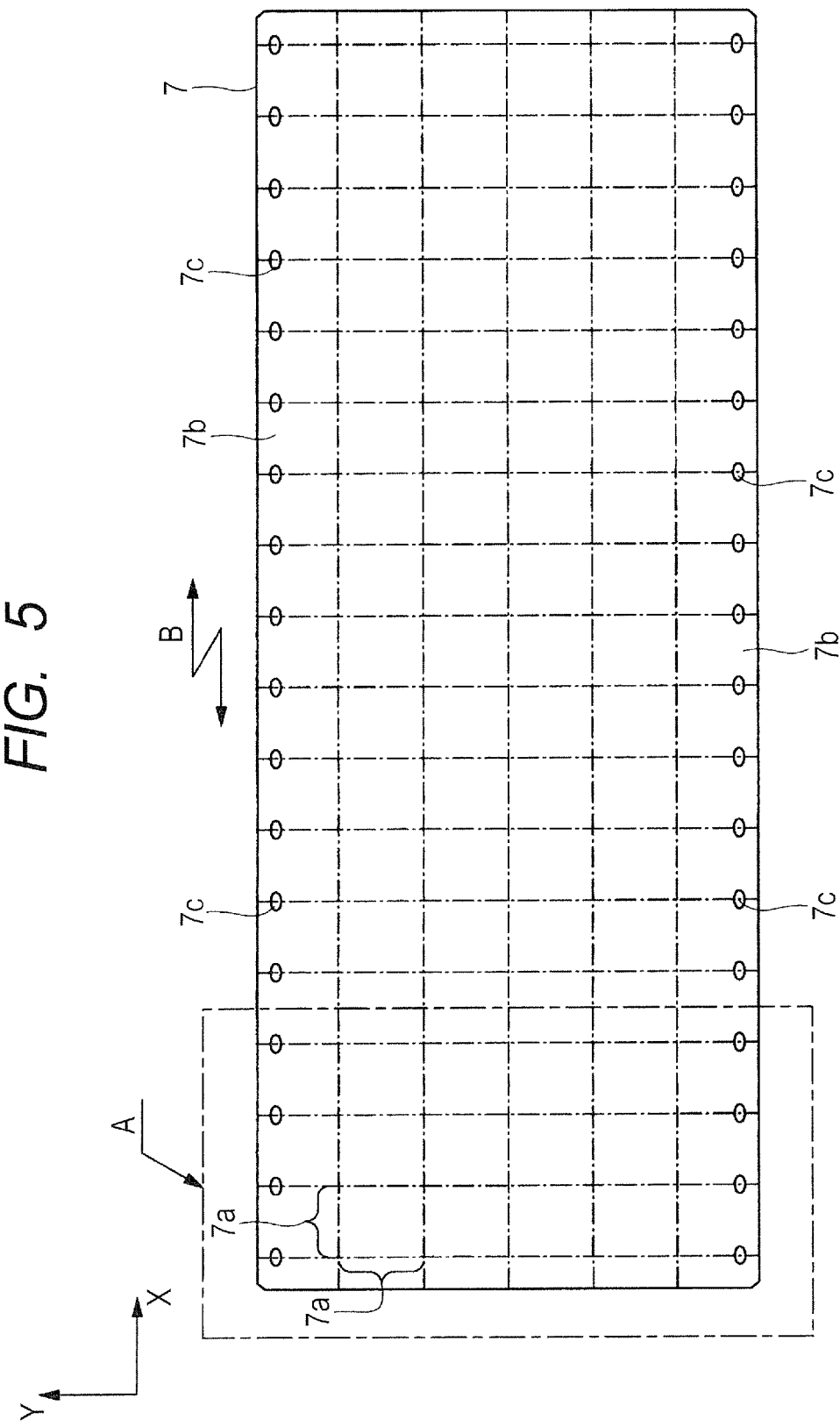
FIG. 5 is a plan view showing an example of the lead frame used to assemble the semiconductor device according to the first embodiment.
Figure 6:
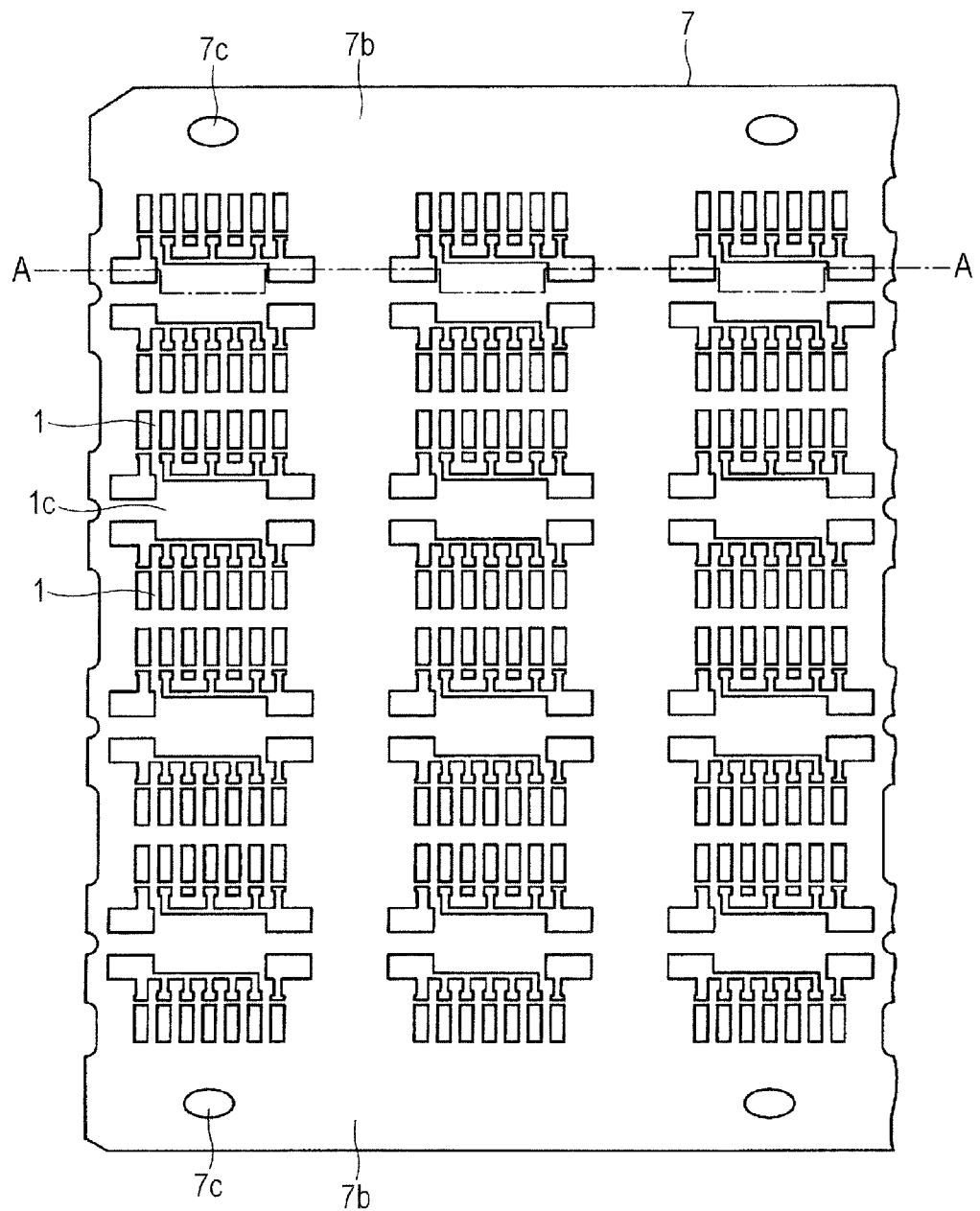
FIG. 6 is an enlarged fragmentary plan view showing an example of the structure of area A shown in FIG. 5.
Figure 7:
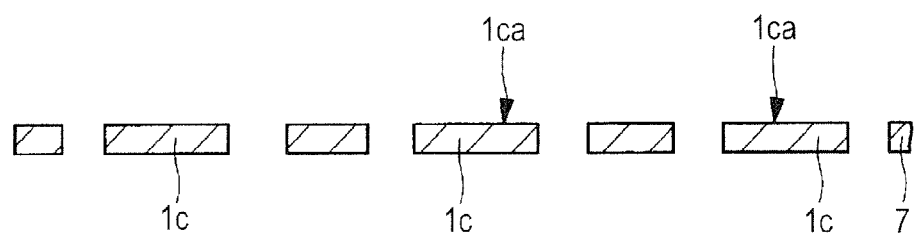
FIG. 7 is a fragmentary sectional view showing an example of the cross section taken along the line A-A in FIG. 6.
Figure 8:
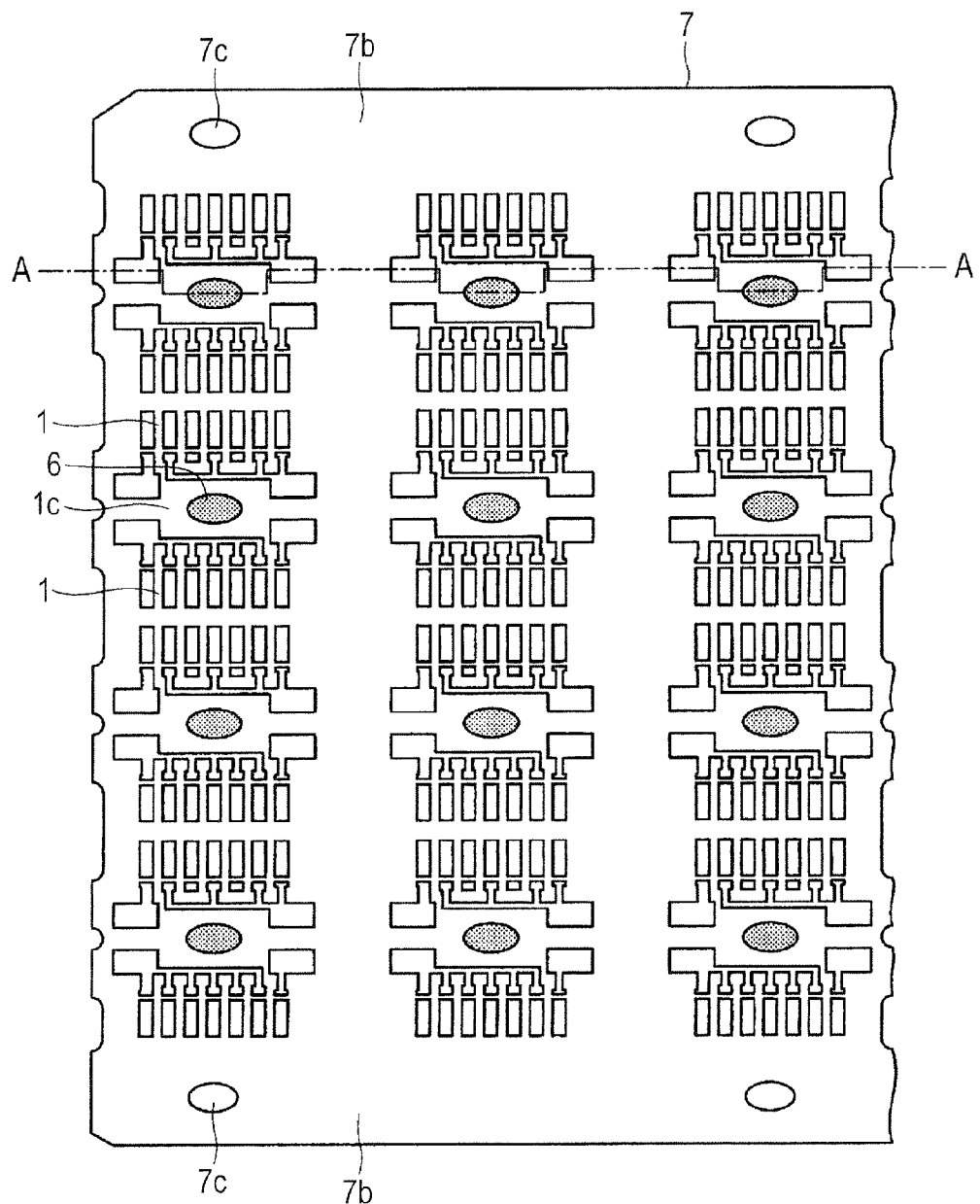
FIG. 8 is a fragmentary plan view showing an example of the die bonding step in the process of assembling a semiconductor device according to the first embodiment.
Figure 9:
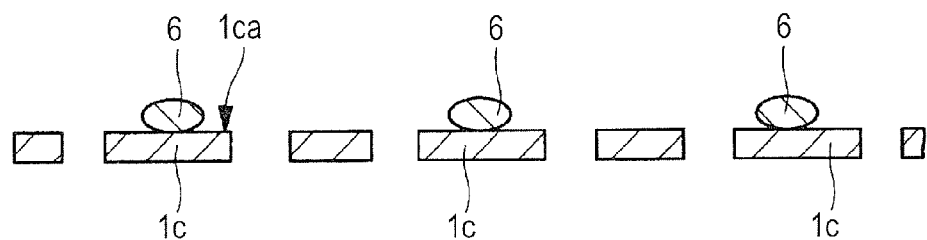
FIG. 9 is a fragmentary sectional view showing an example of the cross section taken along the line A-A in FIG. 8.

FIG. 4 is a flowchart showing an example of the sequence of assembling the semiconductor device shown in FIG. 1; FIG. 5 is a plan view showing an example of the lead frame used to assemble the semiconductor device according to the first embodiment; FIG. 6 is an enlarged fragmentary plan view showing an example of the structure of area A shown in FIG. 5; and FIG. 7 is a fragmentary sectional view showing an example of the cross section taken along the line A-A in FIG. 6. FIG. 8 is a fragmentary plan view showing an example of the die bonding step in the process of assembling a semiconductor device according to the first embodiment and FIG. 9 is a fragmentary sectional view showing an example of the cross section taken along the line A-A in FIG. 8.

Next, the method for manufacturing the semiconductor package 5 will be described in the sequence shown in FIG. 4.

First, in the wafer back grinding step shown in FIG. 4, the back surface of a semiconductor wafer is ground until the semiconductor wafer thickness becomes a prescribed thickness.

Then, the semiconductor wafer is diced to obtain a plurality of non-defective semiconductor chips 2.

Then, die bonding is performed as follows. First, a lead frame 7 which has a plurality of device regions (semiconductor device formation regions) 7a is provided as shown in FIG. 5. In the explanation of the first embodiment given below, it is assumed that the lead frame 7 has a plurality of device regions 7a arranged in a matrix pattern. The lead frame 7 is a plate-like frame member made of, for example, a metal material (Cu alloy) mainly composed of Cu.

In the explanation of the subsequent steps in the process of assembling the semiconductor package 5 according to the first embodiment, twelve device regions 7a (FIG. 5) will be taken as a typical example as shown in FIG. 6. As shown in FIGS. 6 and 7, each of the device regions 7a includes a die pad 1c and a plurality of leads 1 including inner lead parts 1a and outer lead parts 1b are formed around the die pad 1c.

A frame area 7b is formed around each device region 7a and a plurality of through holes 7c which are used for conveyance or positioning are formed at both ends in the width direction of the lead frame 7.

1. Die Bonding

After the lead frame has been prepared, die bonding (FIG. 4) is performed.

In the die bonding step, as shown in FIGS. 8 and 9, first, a solder material 6 as a jointing material (die bonding material) is coated (supplied) on the die pad 1c in each of the device regions 7a of the lead frame 7.

Figure 10:
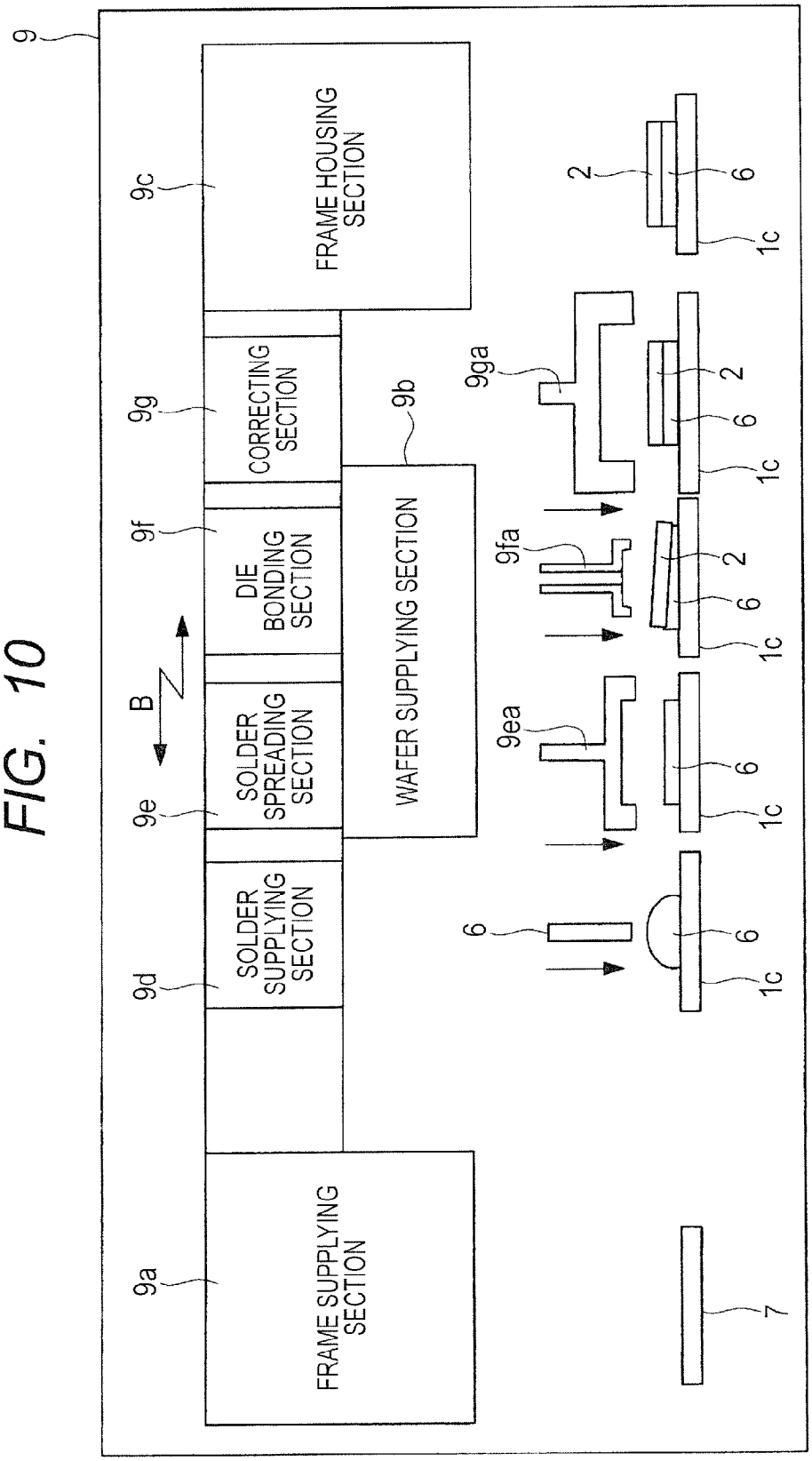
FIG. 10 is a block diagram showing an example of the structure of the die bonder which is used in the die bonding step in the process of assembling a semiconductor device according to the first embodiment.

Next, the die bonder which is used in the first embodiment will be explained. FIG. 10 is a block diagram showing an example of the structure of the die bonder which is used in the die bonding step in the process of assembling a semiconductor device according to the first embodiment.

The structure of the die bonder 9 shown in FIG. 10 is as follows. The die bonder 9 includes a frame supplying section 9a for supplying the lead frame 7 as the object of die bonding, a wafer supplying section 9b for supplying a diced semiconductor wafer, and a frame housing section 9c for housing the lead frame 7 on which die bonding has been performed.

The die bonder 9 further includes a solder supplying section 9d for supplying the solder material 6 to the lead frame 7, a solder spreading section 9e for spreading the solder material 6 on the lead frame 7, a die bonding section 9f for placing a semiconductor chip 2 over the solder material 6 coated on the lead frame 7, and a correcting section 9g for correcting the inclination of the semiconductor chip 2 placed over the solder material 6.

In other words, the die bonder 9, which generates a reducing atmosphere in its processing area, is an integrated processing apparatus which performs the process from picking up a semiconductor chip 2 from the diced semiconductor wafer in the reducing atmosphere to die-bonding the semiconductor chip 2 over the die pad 1c of the lead frame 7.

First, the lead frame 7 is conveyed from the frame supplying section 9a to the solder supplying section 9d. In the solder supplying section 9d, the lead frame 7 is heated to a desired temperature (temperature at which the solder material 6 melts). Then, as shown in FIGS. 8 and 9, the solder material 6 is coated (supplied) on the upper surface 1ca of the die pad 1c in each of the device regions 7a of the lead frame 7 as shown in FIG. 5 (for example, on a row-by-row basis in the conveying direction B). The coated solder material 6 is heated through the die pad 1c and melted.

Figure 11:
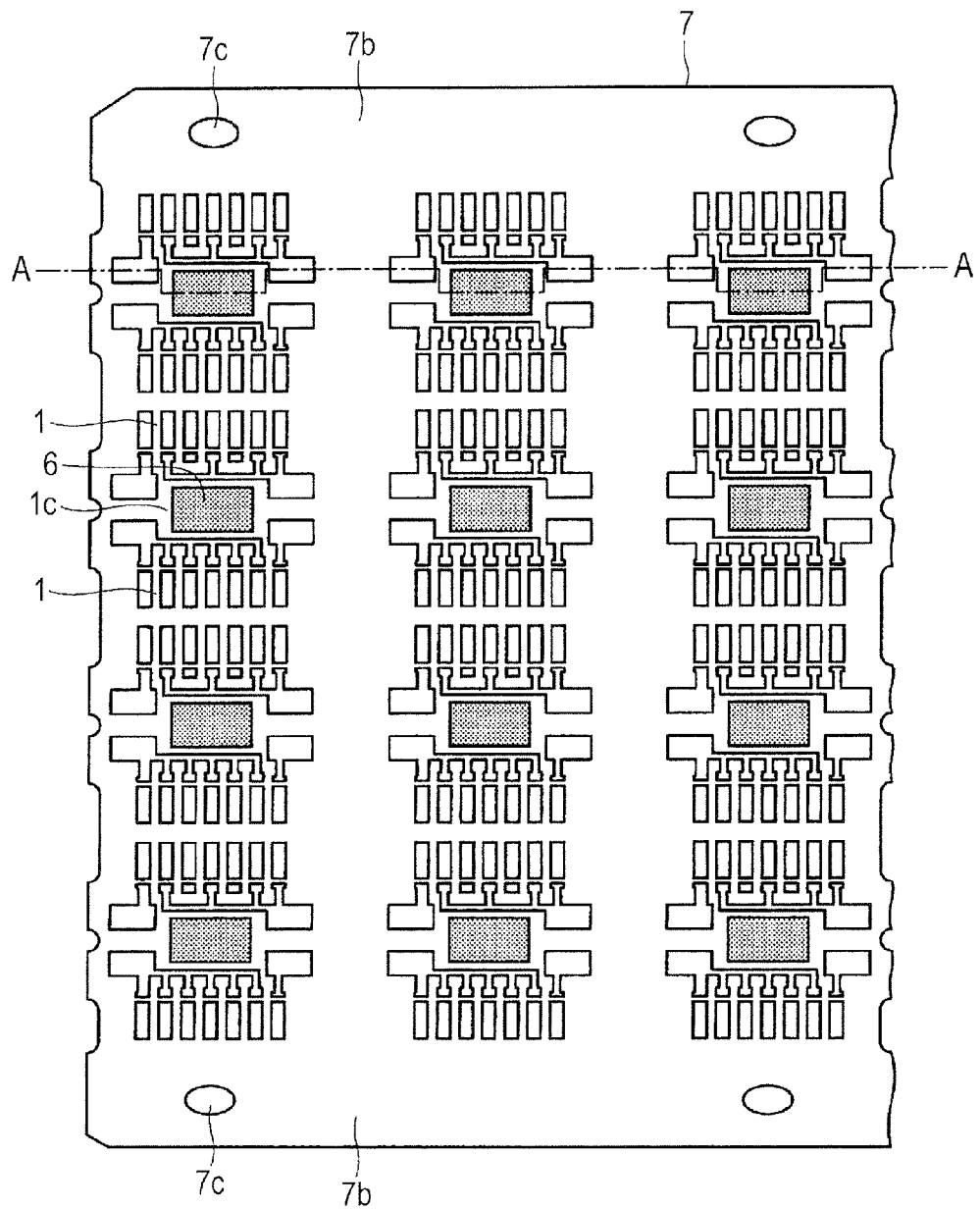
FIG. 11 is a fragmentary plan view showing an example of the die bonding step in the process of assembling a semiconductor device according to the first embodiment.
Figure 12:
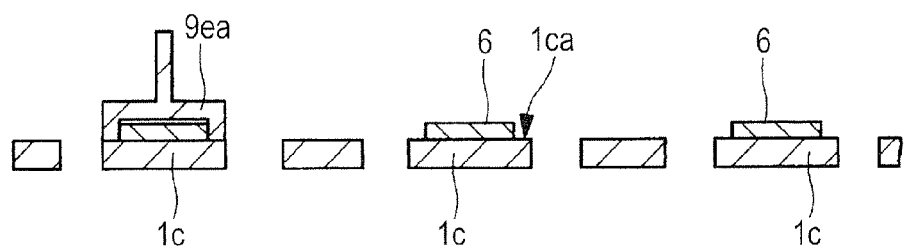
FIG. 12 is a fragmentary sectional view showing an example of the cross section taken along the line A-A in FIG. 11.
Figure 13:
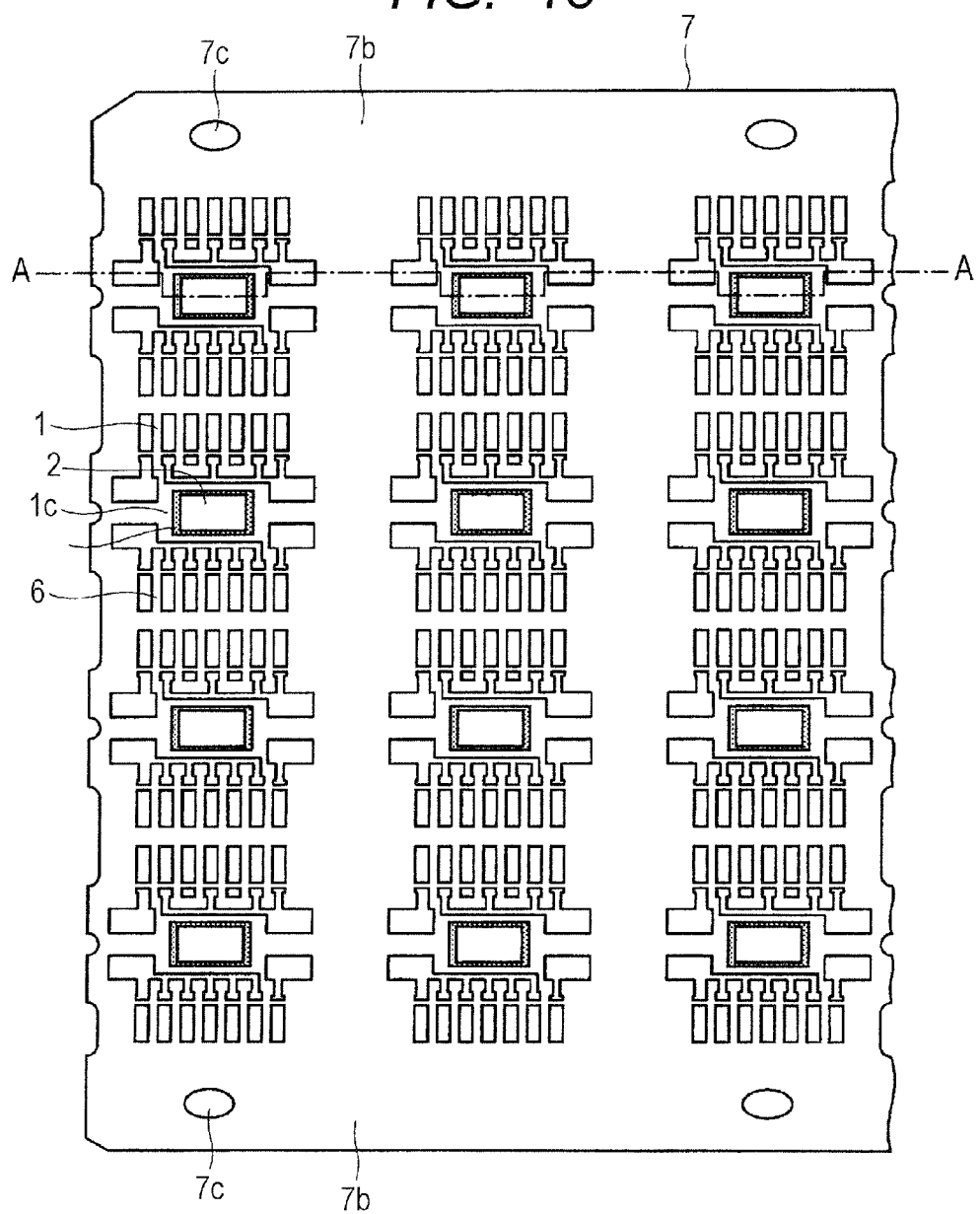
FIG. 13 is a fragmentary plan view showing an example of the die bonding step in the process of assembling a semiconductor device according to the first embodiment.
Figure 14:
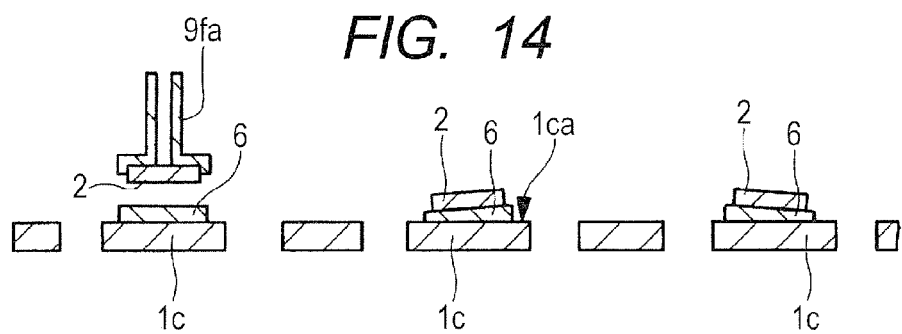
FIG. 14 is a fragmentary sectional view showing an example of the cross section taken along the line A-A in FIG. 13.
Figure 15:
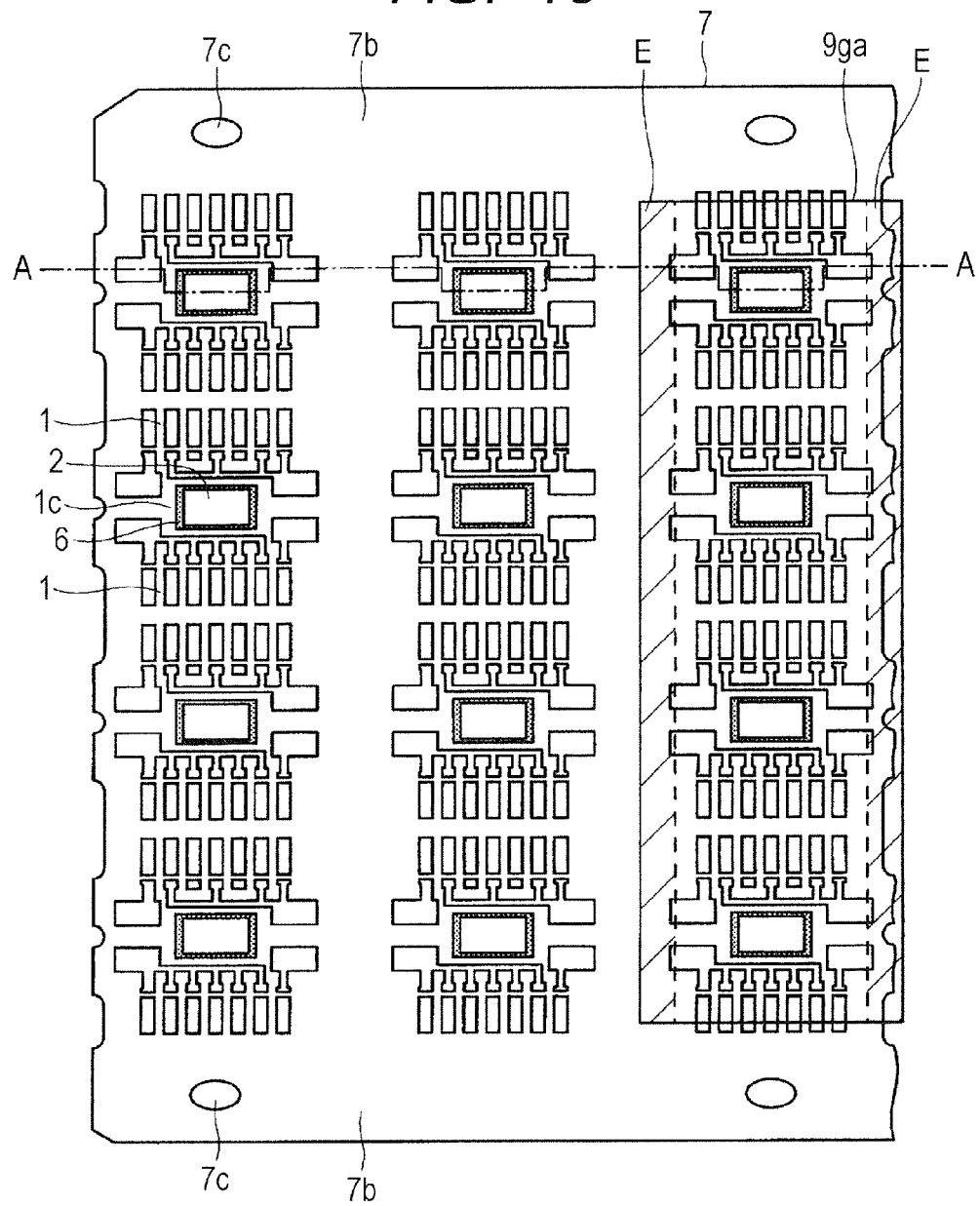
FIG. 15 is a fragmentary plan view showing an example of the die bonding step in the process of assembling a semiconductor device according to the first embodiment.
Figure 16:
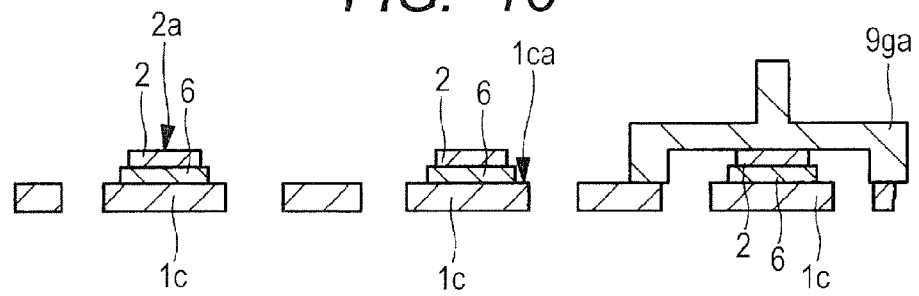
FIG. 16 is a fragmentary sectional view showing an example of the cross section taken along the line A-A in FIG. 15.

Next, the different phases of the die bonding step will be described referring to FIGS. 11 to 16. FIG. 11 is a fragmentary plan view showing an example of the die bonding step in the process of assembling a semiconductor device according to the first embodiment and FIG. 12 is a fragmentary sectional view showing an example of the cross section taken along the line A-A in FIG. 11. FIG. 13 is a fragmentary plan view showing an example of the die bonding step in the process of assembling a semiconductor device according to the first embodiment and FIG. 14 is a fragmentary sectional view showing an example of the cross section taken along the line A-A in FIG. 13. FIG. 15 is a fragmentary plan view showing an example of the die bonding step in the process of assembling a semiconductor device according to the first embodiment and FIG. 16 is a fragmentary sectional view showing an example of the cross section taken along the line A-A in FIG. 15.

As shown in FIGS. 10 to 12, the molten solder material 6 is spread in the solder spreading section 9e. Specifically the solder material 6 is spread out by a spanker 8ea. More specifically, the solder material 6 is spread out so that it becomes quadrangular like the back surface 2b of the semiconductor chip 2 as shown in FIG. 3 (FIG. 11).

Then, in the die bonding section 9f shown in FIG. 10, a semiconductor chip 2 is placed over each solder material 6 as shown in FIGS. 13 and 14. More specifically, using a die bonding head 9fa a semiconductor chip 2 is picked up by vacuum suction, etc. from the diced semiconductor wafer in the wafer supplying section 9b shown in FIG. 10 and the semiconductor chip 2 is placed (mounted) over the solder material 6 over a die pad 1c in the lead frame 7 placed in the die bonding section 9f. At this time, the solder material 6 is in a molten state.

Then, in the correcting section 9g shown in FIG. 10, the inclination of the semiconductor chip 2 placed over the solder material 6 is corrected. Specifically, as shown in FIGS. 15 and 16, while the solder material 6 is in a molten state, the correcting tool 9ga is pressed against the main surface (upper surface) 2a of the semiconductor chip 2 to correct the inclination of the semiconductor chip 2.

In the die bonder 9 according to the first embodiment, the correcting section 9g is located after the die bonding section 9f. Thus, the correcting tool 9ga is located after the die bonding head 9fa, so correction can be performed without the need for adding a new step and without a decline in throughput (also called index).

Figure 17:
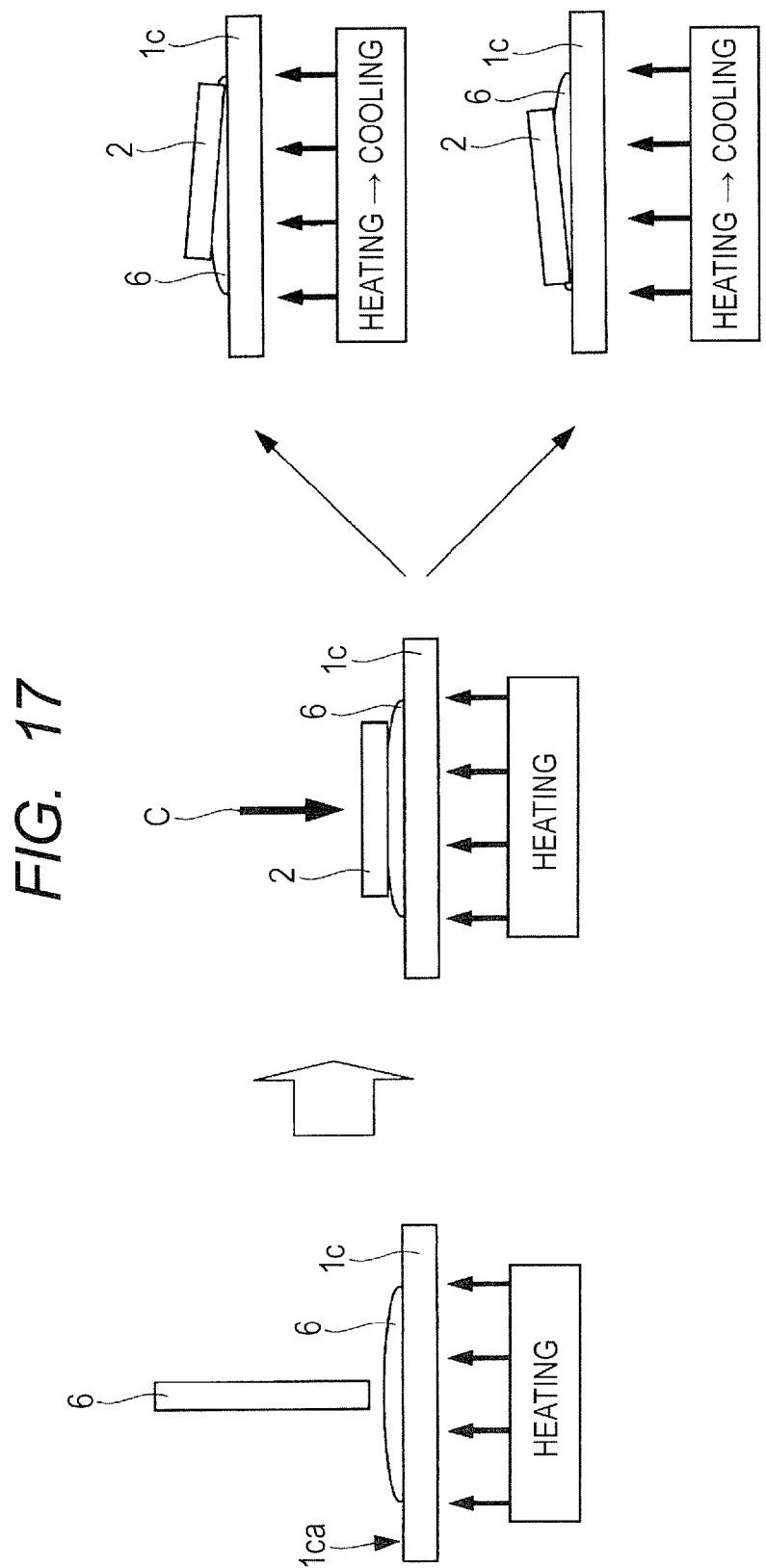
FIG. 17 is a side view of a comparative example, showing a semiconductor chip placed in an inclined manner by die bonding.

Next, why the problem that the semiconductor chip 2 is mounted in an inclined manner in the die bonding step arises will be explained in detail. FIG. 17 is a side view of a comparative example, showing a semiconductor chip mounted in an inclined manner by die bonding.

As shown in FIG. 17, the supplied solder material 6 is melted through the heated die pad 1c and a semiconductor chip 2 is placed over the molten solder material 6. Immediately after the semiconductor chip 2 is placed over the solver material 6 by the die bonding head 9fa shown in FIG. 10, a given weight C is applied to the semiconductor chip 2 by the die bonding head 9fa as shown in FIG. 17. After that, the die bonding head 9fa is retracted.

Then, heating through the die pad 1c shifts to the cooling phase. Meanwhile, the semiconductor chip 2 becomes inclined due to fluctuations in solder wettability, fluctuations in the amount of solder or the like. This inclination would cause fluctuations in the electrical characteristics, fluctuations in heat radiation characteristics, fluctuations in impact resistance (solder thickness fluctuations) or fluctuations in wire-bondability in the semiconductor device, leading to decline in the reliability of the semiconductor device.

Next, an explanation will be given of the reason that the semiconductor chip 2 easily becomes inclined when the solder material 6 is used as the die bonding material (jointing material). This is related to the low thixotropy of the solder material 6. Thixotropy is the following property exhibited by an object (fluid): the fluidity of the object is high while a force is being applied to it and when the object is released, its fluidity becomes low. Since the solder material 6 is low in thixotropy, when the die bonding head 9fa is retracted, the solder material 6 is released and becomes easy to move. Probably this is the reason that the semiconductor chip 2 becomes inclined.

On the other hand, if the die bonding material is a silver paste or the like, its thixotropy is high and even when it is released as the die bonding head 9fa is retracted, it does not move. Consequently, the semiconductor chip 2 hardly becomes inclined.

Because of the above mechanism, when the solder material 6 is used, the semiconductor chip 2 is more likely to become inclined than when a silver paste or the like is used.

As a solution to this problem, in the first embodiment, the correcting tool 9ga is pressed against the main surface (upper surface) 2a of the semiconductor chip 2 while the solder material 6 is in a molten state and the temperature of the solder material 6 is decreased with the correcting tool 9ga held pressed to harden (solidify) the solder material 6 (the correcting tool 9ga is held pressed until the temperature becomes lower than the solid-phase temperature) in order to correct the inclination of the semiconductor chip 2.

Figure 18:
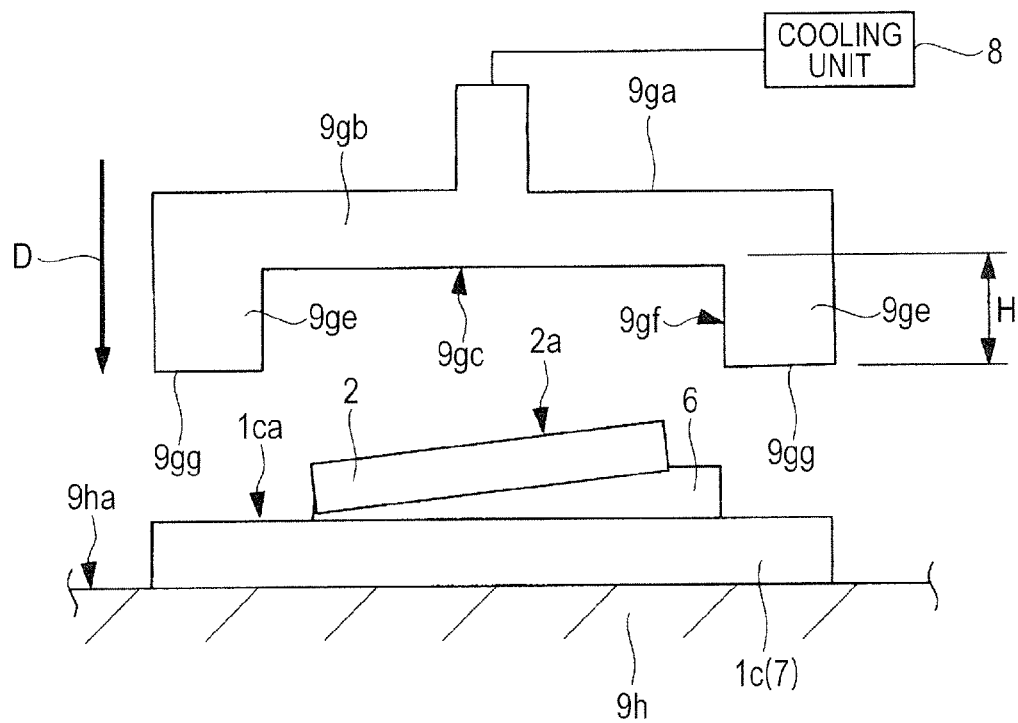
FIG. 18 is a partially sectional side view showing an example of the correcting tool to be pressed against a chip in the die bonding step according to the first embodiment.
Figure 19:
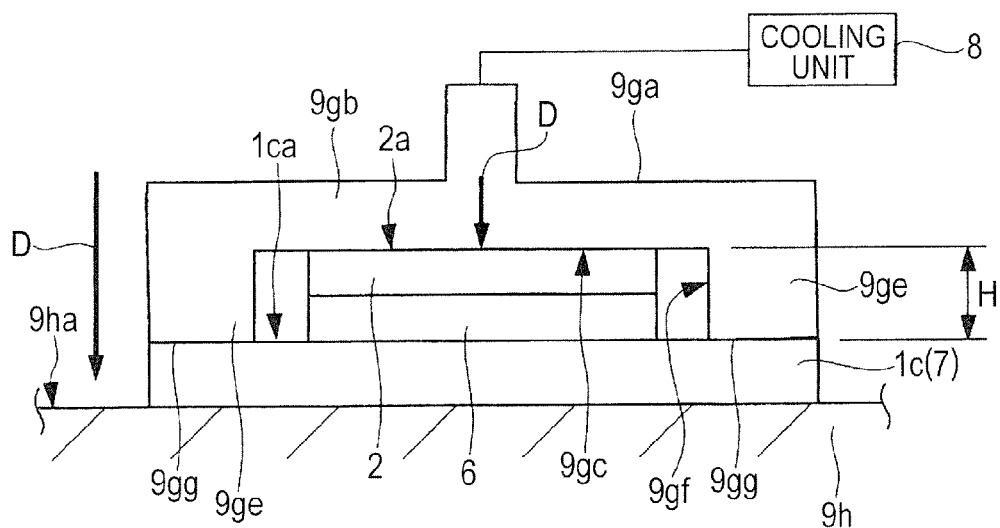
FIG. 19 is a partially sectional side view showing an example of a correcting tool pressed against the chip in the die bonding step according to the first embodiment.
Figure 20:
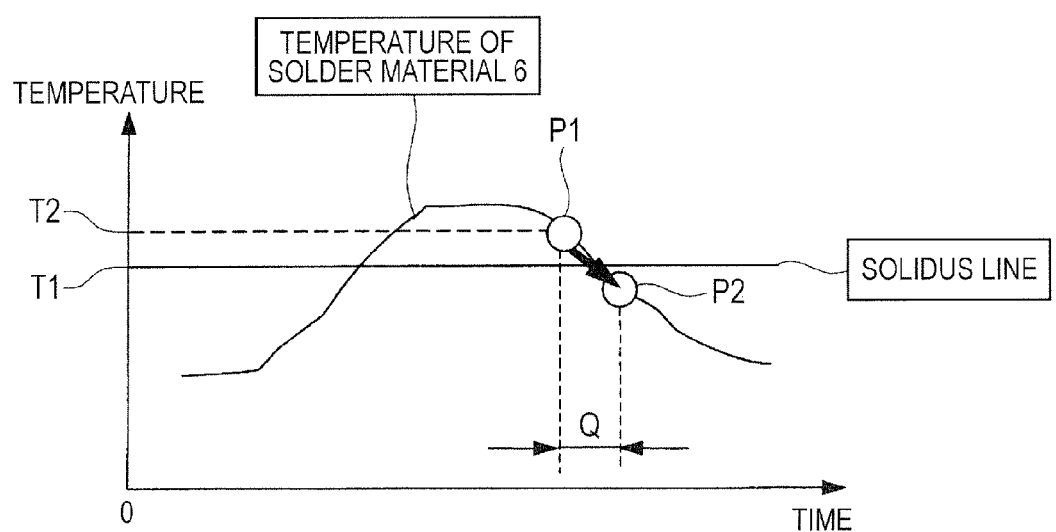
FIG. 20 is a graph showing an example of timing to press the correcting tool against the chip in the die bonding step according to the first embodiment.
Figure 21:
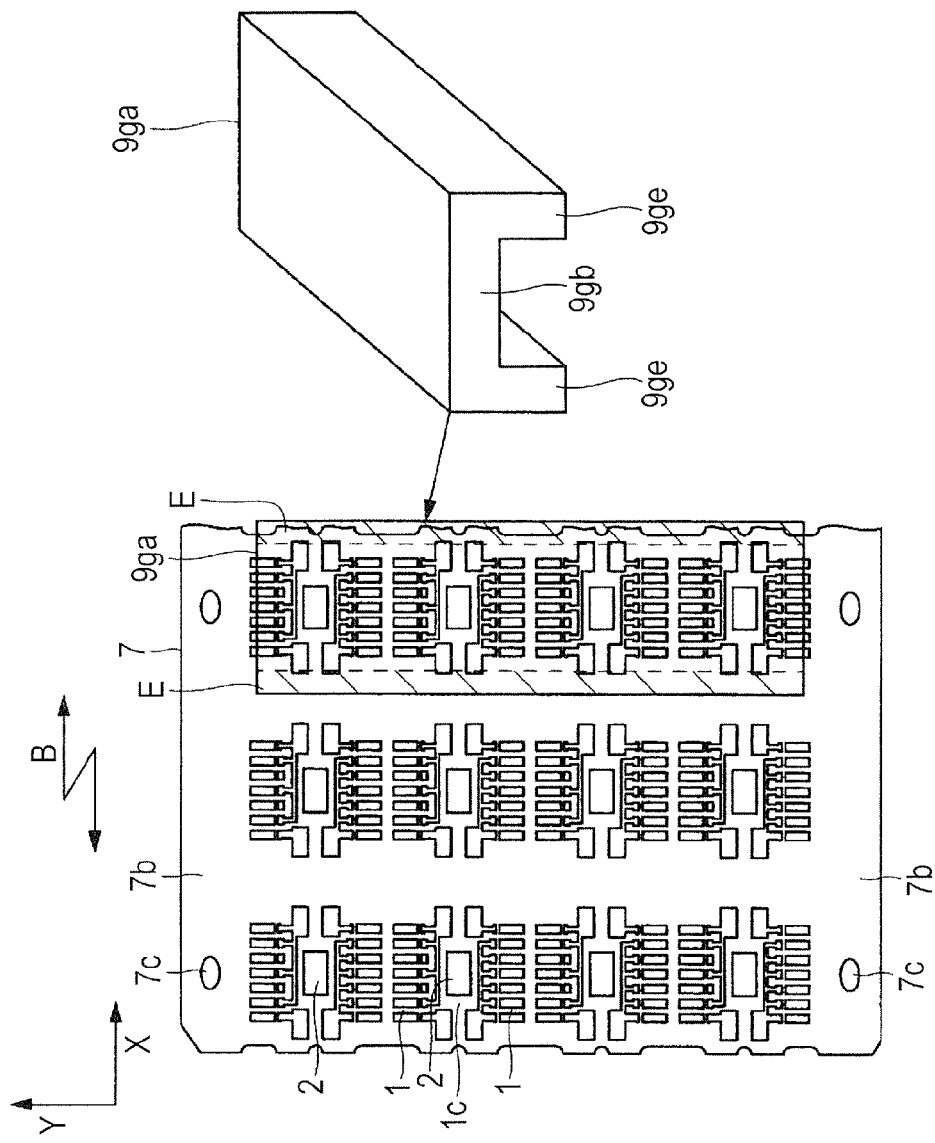
FIG. 21 is a fragmentary plan view combined with a perspective view, showing an example of the area to be pressed by the correcting tool in the die bonding step according to the first embodiment.

Next, the shape of the correcting tool 9ga which is used in the first embodiment will be explained. FIG. 18 is a partially sectional side view showing an example of the correcting tool to be pressed against a chip in the die bonding step according to the first embodiment and FIG. 19 is a partially sectional side view showing an example of the correcting tool pressed against the chip in the die bonding step according to the first embodiment. FIG. 20 is a graph showing an example of timing to press the correcting tool against the chip in the die bonding step according to the first embodiment and FIG. 21 is a fragmentary plan view combined with a perspective view, showing an example of the area to be pressed by the correcting tool in the die bonding step according to the first embodiment.

As shown in FIGS. 18 and 19, the correcting tool 9ga includes a first part 9gb having a first surface 9gc along a support surface 9ha of a support member 9h capable of supporting the die pad 1c and a second part 9ge having a second surface 9gf intersecting with the first surface 9gc.

The support member 9h for supporting the die pad 1c is, for example, a stage and the support surface 9ha is the upper surface of the stage. Alternatively, the support member 9h may be a rail or the like.

The first surface 9gc of the first part 9gb of the correcting tool 9ga is a surface almost parallel to the support surface 9ha of the support member 9h and also is a surface to contact the main surface (upper surface) 2a of the semiconductor chip 2. In other words, the first surface 9gc is a surface facing the main surface (upper surface) 2a of the semiconductor chip 2. The second part 9ge, having the second surface 9gf almost perpendicular to the first surface 9gc, is a support part. In other words, the correcting tool 9ga in the first embodiment is a flattened U-shaped block member which has an opening toward the pressing direction D (first direction) shown in FIG. 18.

In order to correct the inclination of the semiconductor chip 2, as shown in FIG. 19 the first surface 9gc of the first part 9gb of the correcting tool 9ga is pressed against the main surface 2a of the semiconductor chip 2 lying over the molten solder material 6.

Height H of the second surface 9gf of the second part 9ge of the correcting tool 9ga in the pressing direction D should be equal to the sum of the thickness of the semiconductor chip 2 and the thickness of the solder material 6 of the assembled semiconductor package 5.

In the inclination correction process, the solder material 6 is hardened while the first surface 9gc of the correcting tool 9ga is pressed against the main surface 2a of the semiconductor chip 2 and also the lower surfaces 9gg of both the second parts 9ge of the correcting tool 9ga are pressed against the lead frame 7.

Thus, even if the accuracy in the descent position of the correcting tool 9ga for inclination correction is not high, since the second parts 9ge (support part) of the correcting tool 9ga are in contact with (pressed against) the lead frame 7, the height of the semiconductor chip 2 including the solder material 6 can be determined with high accuracy. As a consequence, after the height (position) of the main surface 2a of the semiconductor chip 2 is determined with high accuracy, the inclination of the semiconductor chip 2 is corrected.

Furthermore, since the second parts 9ge (support parts) of the correcting tool 9ga on the both sides are designed to contact the lead frame 7, the correction ability is not impaired even if the lead frame 7 warps due to heat.

In the inclination correction process, the correcting tool 9ga is pressed against the semiconductor chip 2 when the temperature of the molten solder material 6 is higher than the solid phase temperature of the solder material 6 and the correcting tool 9ga is held pressed against the semiconductor chip 2 until the temperature of the solder material 6 becomes lower than the solid phase temperature, and then the correcting tool 9ga is released from the semiconductor chip 2.

Specifically, as shown in FIG. 20, cooling is started when the solder material 6 has a higher temperature than its solid phase temperature (T1: solidus line) (T2: the solder material 6 is in a molten state), and the correcting tool 9ga is pressed against the main surface 2a of the semiconductor chip 2 (correction start point P1) immediately after the start of cooling. This transfers the heat of the semiconductor chip 2 to the correcting tool 9ga, resulting in a drop in the temperature of the semiconductor chip 2. As the temperature of the semiconductor chip 2 drops, the temperature of the solder material 6 also drops.

The correcting tool 9ga is held pressed until the temperature of the solder material 6 becomes lower than the solid phase temperature T1 and when the temperature is enough below the solid phase temperature T1 and the solder material 6 is hardened (correcting tool release point P2) or after it is hardened, the correcting tool 9ga is released from the semiconductor chip 2.

In other words, in the inclination correction process according to the first embodiment, after the semiconductor chip 2 is placed over the molten solder material 6 coated over the die pad 1c, cooling is started while the solder material 6 is in a molten state. Immediately after the start of cooling, at a point (P1) slightly higher than the solidus line (solid phase temperature), the first surface 9gc of the first part 9gb of the correcting tool 9ga, which is kept almost parallel to the support surface 9ha of the support member 9h (stage, etc.), is pressed against the main surface 2a of the semiconductor chip 2.

The inclination of the semiconductor chip 2 is thus corrected and heat is removed from the semiconductor chip 2 by the correcting tool 9ga. Consequently the temperature of the semiconductor chip 2 drops and the temperature of the solder material 6 also drops. As the temperature of the solder material 6 becomes lower than the solid phase temperature (solidus line), the solder material 6 is hardened. Since the correcting tool 9ga has been pressed against the main surface 2a of the semiconductor chip 2 up to that point, the solder material 6 is hardened and the semiconductor chip 2 is mounted without an inclination of the main surface 2a of the semiconductor chip 2.

After the solder material 6 is hardened, the correcting tool 9ga is released from the main surface 2a of the semiconductor chip 2 (P2).

For example, if the solder material 6 is Sn-37Pb solder, the solid phase temperature T1 is 183° C. and at the time (T2) when solid phase temperature T1+about 5 to 20° C. is reached, correction is started, namely, the correcting tool 9ga is pressed against the main surface 2a of the semiconductor chip 2. Then, the correcting tool 9ga is held pressed for approximately time Q until the temperature of the solder material 6 becomes lower than the solid phase temperature T1. Time Q from P1 to P2 is several seconds or so.

In the inclination correction process according to the first embodiment, the correcting tool 9ga should remove heat from the heated solder material 6 through the semiconductor chip 2. Therefore, it is desirable that the correcting tool 9ga be provided with a cooling mechanism. Since the correcting tool 9ga is heated at each time to perform the correction process, if the correcting tool 9ga is provided with a cooling mechanism, the die bonder 9 can be continuously operated.

In the inclination correction process according to the first embodiment, the correcting tool 9ga is coupled to a cooling unit 8 for cooling the correcting tool 9ga as shown in FIG. 18. For example, the cooling unit 8 supplies a cooling medium to the correcting tool 9ga for air or water cooling. The correcting tool 9ga has a cooling mechanism which circulates the cooling medium.

In the correction process, as shown in FIG. 21, the second parts 9ge of the correcting tool 9ga are pressed against the outer portions of the device regions (semiconductor device formation regions) 7a of the lead frame 7 as shown in FIG. 5. More specifically, the second parts 9ge (support parts) of the correcting tool 9ga are pressed against the outer portions (areas E in FIG. 21 (hatching)) of the device regions 7a.

Consequently, the correcting tool 9ga does not contact the product area of the lead frame 7, thereby preventing damage to the product area of the lead frame 7 which might occur due to contact of the correcting tool 9ga.

In the correction process, it is desirable to press the correcting tool 9ga against the main surfaces 2a (FIG. 3) of a plurality of semiconductor chips 2 at a time as shown in FIG. 21. In other words, correction can be performed efficiently by pressing the correcting tool 9ga against several (for example, four) semiconductor chips 2.

When the correcting tool 9ga is pressed against several semiconductor chips 2 at a time, it is desirable to press the correcting tool 9ga against the main surfaces 2a of a row of semiconductor chips 2 arranged in the direction (Y direction) intersecting with the conveying direction B for the lead frame 7 (X direction).

In the die bonder 9 shown in FIG. 10, a series of processing stages (solder supply, solder spreading, die bonding, and inclination correction) are performed for semiconductor chips on a row-by-row basis in the conveying direction B for the lead frame 7 (X direction) shown in FIG. 21. If an inclination is corrected on a chip-by-chip basis (in every device region 7a), the solder material 6 in a corrected device region 7a in the same row in the Y direction might melt again during inclination correction in the next device region 7a.

Therefore, by pressing the correcting tool 9ga against the main surfaces 2a of a row of semiconductor chips 2 arranged in the Y direction (direction intersecting with the conveying direction B) at a time, correction can be performed efficiently without affecting the correction performed previously.

In the above method, a semiconductor chip 2 is mounted over the upper surface 1ca of the die pad 1c through the solder material 6 in each of the device regions 7a of the lead frame 7 which are arranged in a matrix pattern, while the inclination of the semiconductor chip 2 is corrected.

Figure 22:
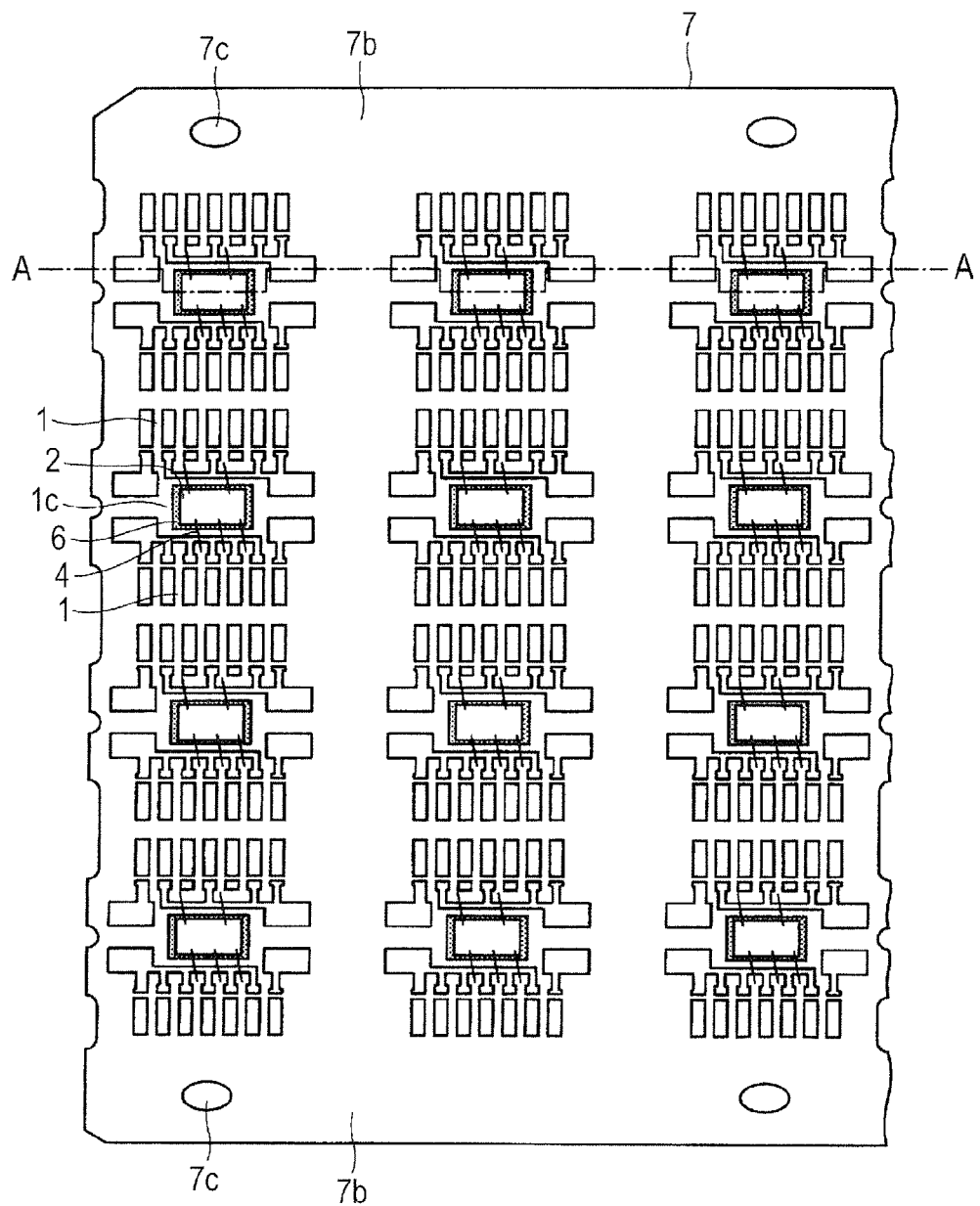
FIG. 22 is a fragmentary plan view showing an example of the wire bonding step in the process of assembling a semiconductor device according to the first embodiment.
Figure 23:
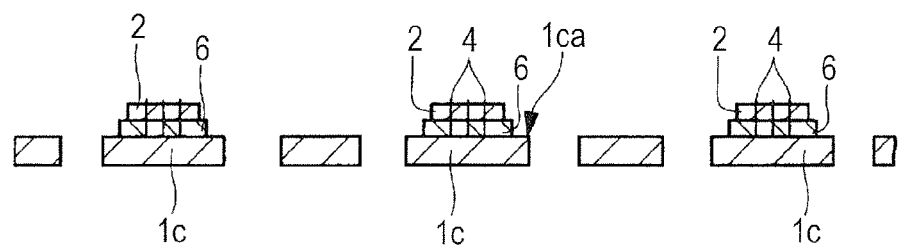
FIG. 23 is a fragmentary sectional view showing an example of the cross section taken along the line A-A in FIG. 22.
Figure 24:
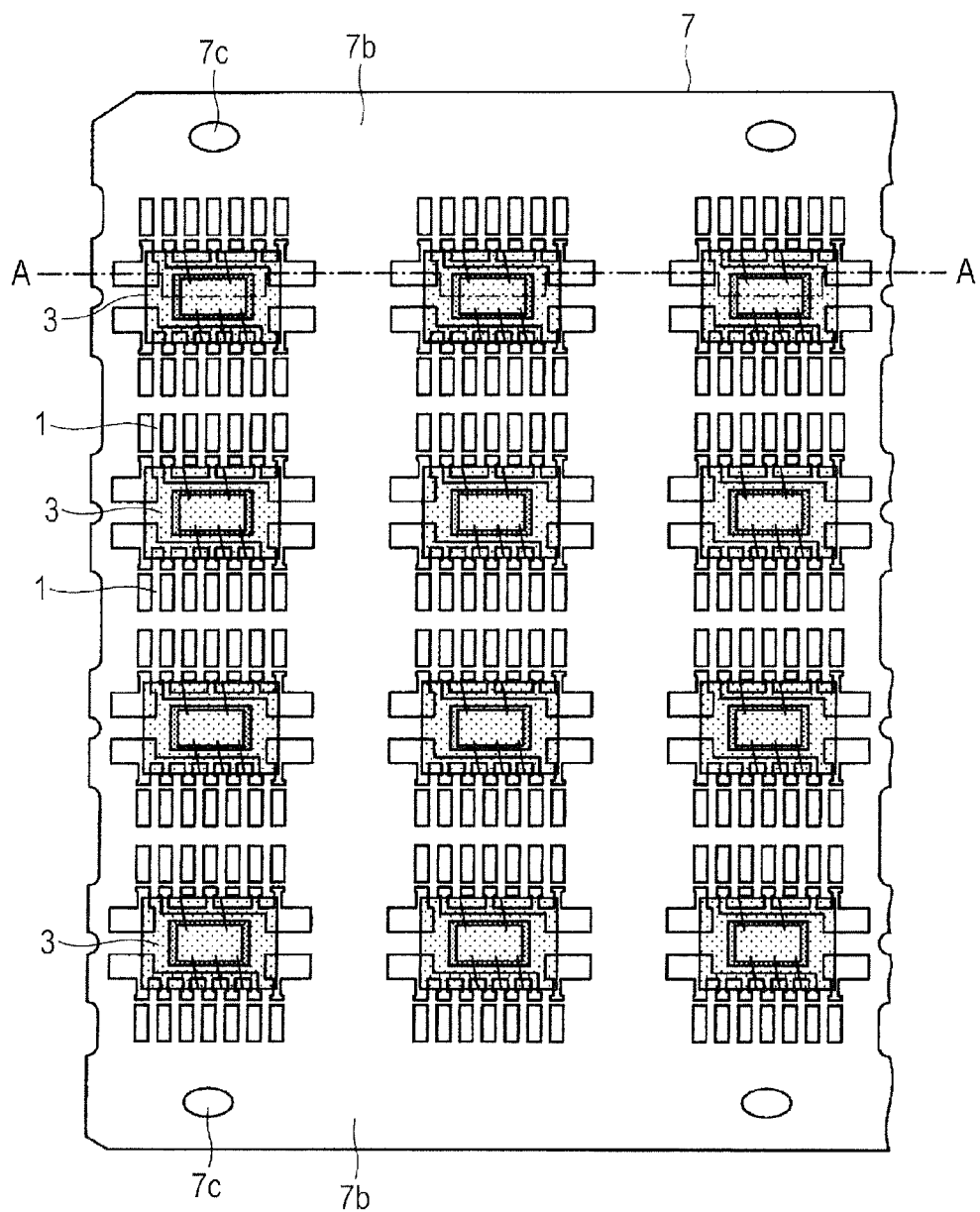
FIG. 24 is a fragmentary plan view showing an example of the mold sealing step in the process of assembling a semiconductor device according to the first embodiment.
Figure 25:
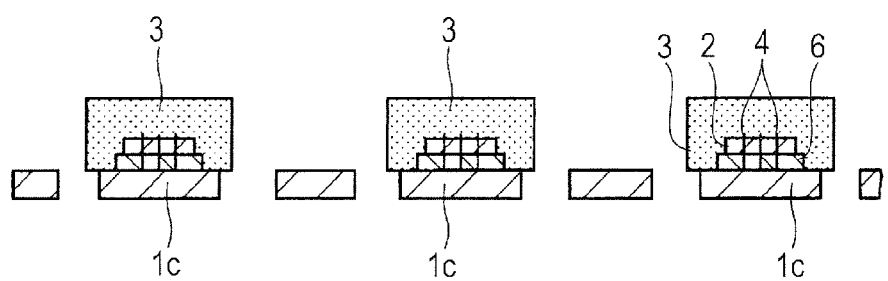
FIG. 25 is a fragmentary sectional view showing an example of the cross section taken along the line A-A in FIG. 24.
Figure 26:
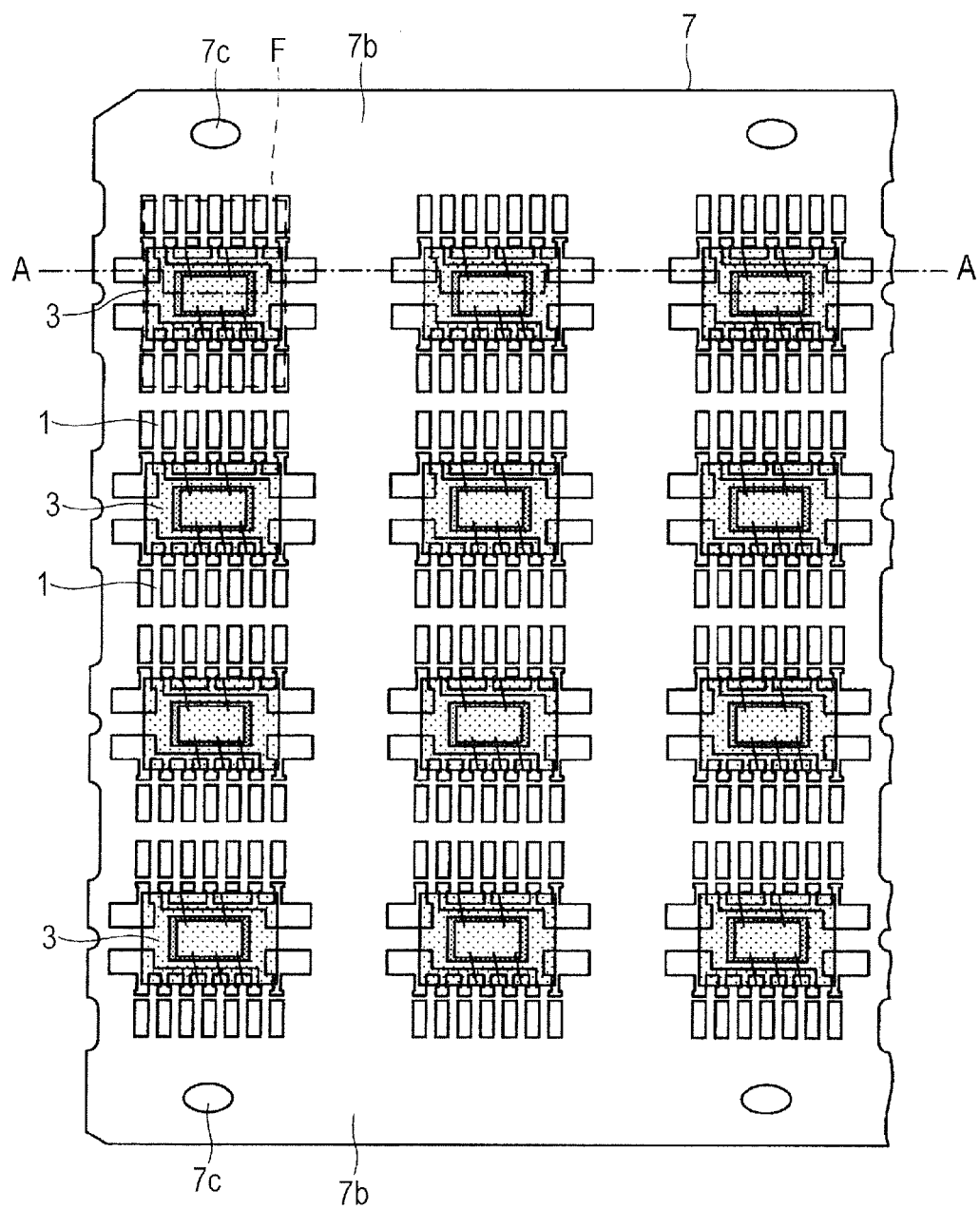
FIG. 26 is a fragmentary plan view showing an example of the individualization (lead cutting) step in the process of assembling a semiconductor device according to the first embodiment.
Figure 27:
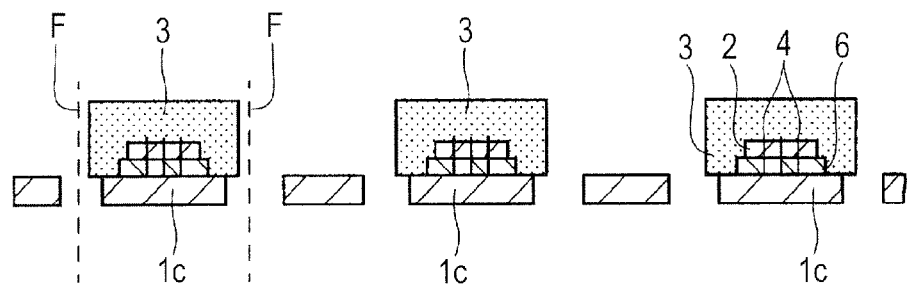
FIG. 27 is a fragmentary sectional view showing an example of the cross section taken along the line A-A in FIG. 26.

FIG. 22 is a fragmentary plan view showing an example of the wire bonding step in the process of assembling a semiconductor device according to the first embodiment and FIG. 23 is a fragmentary sectional view showing an example of the cross section taken along the line A-A in FIG. 22. FIG. 24 is a fragmentary plan view showing an example of the mold sealing step in the process of assembling a semiconductor device according to the first embodiment and FIG. 25 is a fragmentary sectional view showing an example of the cross section taken along the line A-A in FIG. 24. FIG. 26 is a fragmentary plan view showing an example of the individualization (lead cutting) step in the process of assembling a semiconductor device according to the first embodiment and FIG. 27 is a fragmentary sectional view showing an example of the cross section taken along the line A-A in FIG. 26.

2. Wire Bonding

After die bonding is finished, the wire bonding step (FIG. 4) is performed.

In the wire bonding step, as shown in FIGS. 22 and 23, the electrode pads 2c (FIG. 3) of the semiconductor chip 2 are electrically coupled to the inner lead parts 1a (FIG. 3) through wires 4.

3. Post-Assembly Appearance Inspection

After wire bonding is finished, post-assembly appearance inspection (FIG. 4) is carried out. In this step, the wires 4 are checked for peeling, etc.

4. Mold Sealing

After post-assembly appearance inspection is finished, mold sealing (FIG. 4) is performed.

In the mold sealing step, as shown in FIGS. 24 and 25, a sealing member 3 which seals the semiconductor chip 2, wires 4 and inner lead parts 1a in each device region 7a is formed using sealing resin.

In the mold sealing step according to the first embodiment, the sealing member 3 is formed so that the lower surface 1cb of the die pad 1c is exposed from the lower surface 3b of the sealing member 3 as shown in FIG. 3. The sealing resin is, for example, thermosetting epoxy resin.

5. Coating

After mold sealing is finished, coating (FIG. 4) is performed.

In the coating step, a coating film such as a solder coating is made on the outer lead parts 1b and the lower surface 1cb of the die pad 1c.

6. Marking

After coating, marking (FIG. 4) is performed.

In the marking step, for example, a desired mark (stamp) is made on the surface of the sealing member 3. For example, the mark indicates the type or model number of the product. The mark is made by laser irradiation or the like.

7. Lead Cutting (Individualization)

After marking, lead cutting (FIG. 4) is performed.

In the lead cutting step, individualization is performed by punching each of the device regions 7a. Specifically, as shown in FIGS. 26 and 27, the outer lead parts 1b (FIG. 2) and the frame area 7b (FIG. 5) are separated by punching (cutting) in the F area of each device region 7a and each outer lead part 1b is bent into a prescribed shape (gull-wing shape in this case).

By performing the above steps, assembling of the semiconductor package 5 is finished.

After that, as shown in FIG. 4, burn-in testing, final appearance inspection, and packing are performed before shipment.

In the method for manufacturing a semiconductor device (semiconductor package 5) according to this embodiment, the inclination of the semiconductor chip 2 can be decreased in the die bonding step so that the thermal resistance problem or on-resistance problem caused by an inclination of the chip is reduced.

More specifically, the method reduces fluctuations in the electric characteristics, heat radiation characteristics, wire bondability, impact resistance of the semiconductor package 5 which are caused by a semiconductor chip 2 mounted in an inclined manner, thereby contributing to stability in the quality of the semiconductor package 5. As a consequence, the reliability of the semiconductor package 5 is improved.

In addition, recognition errors in the wire bonding step which are attributable to an inclination of the semiconductor chip 2 can be decreased, so bondability (wire bondability) is improved.

In addition, the correcting tool 9ga has the second parts 9ge as support parts and the tips (lower surfaces 9gg) of the second parts 9ge contact the lead frame 7 in the correction process. Consequently, even if the lead frame 7 warps when it is heated to a high temperature in the die bonder 9, inclination correction can be performed.

When device regions are arranged in a matrix pattern in the lead frame 7, inclinations of one row of chips (for one cycle) arranged in the direction intersecting with the lead frame conveying direction B are corrected at a time so that correction can be performed efficiently without causing the solder material 6 to melt again. Thus, the productivity in the manufacturing process of the semiconductor package 5 is improved.

In addition, in the die bonder 9, the correcting section 9g is provided after the die bonding section 9f. Consequently, inclination correction and die bonding are performed without the need for an investment in a new apparatus and without causing decline in throughput (index).

Variation

Figure 28:
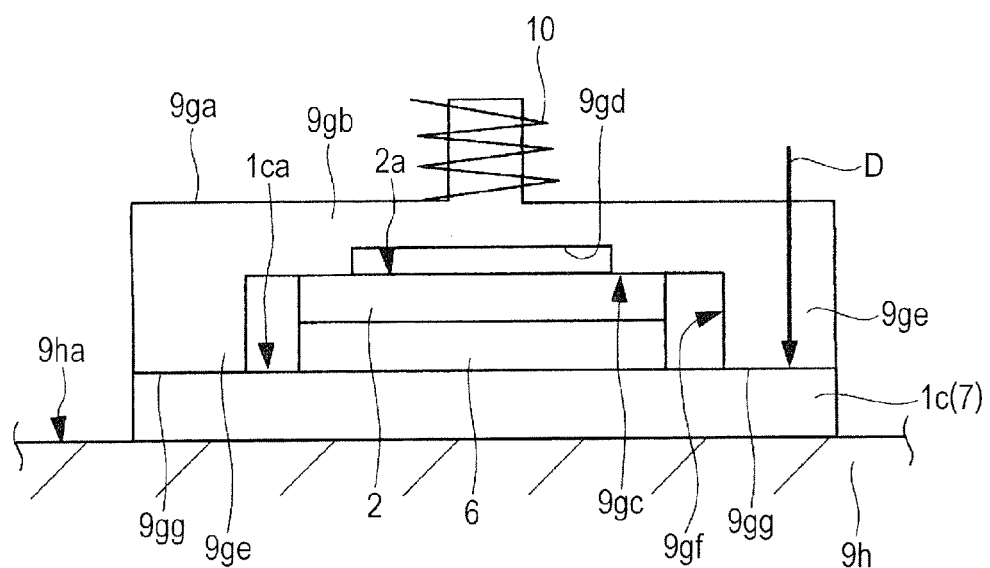
FIG. 28 is a partially sectional side view showing the structure of a correcting tool according to a variation of the first embodiment.

FIG. 28 is a partially sectional side view showing the structure of a correcting tool as a variation of the first embodiment.

In the correcting tool 9ga shown in FIG. 28, a concave 9gd is made in the first surface 9gc of the first part 9gb. The concave 9gd is a portion recessed in the direction (second direction) opposite to the pressing direction D. In the inclination correction process, the area of the first surface 9gc of the correcting tool 9ga except the concave 9gd (for example, the area (third portion) around the concave 9gd) is pressed against the main surface 2a of the semiconductor chip 2.

The concave 9gd thus made in the first surface 9gc of the correcting tool 9ga which is to contact the semiconductor chip 2 decreases the area of contact between the correcting tool 9ga and the main surface 2a of the semiconductor chip 2 during correction, thereby reducing the possibility of the semiconductor chip 2 being stained or damaged during correction.

However, the size and position of the concave 9gd must be determined so that the heat transfer to the correcting tool 9ga through the semiconductor chip 2 (to harden the solder material 6 in the correction process) is not impaired.

As shown in FIG. 28, a spring 10, an elastic member, may be provided to press the correcting tool 9ga against the semiconductor chip 2. The spring 10 keeps the correcting tool 9ga pressed against the semiconductor chip 2 and the lead frame 7 during correction, thereby preventing the correcting tool 9ga from getting out of contact with the lead frame 7.

This eliminates the need for high accuracy in the descent position of the correcting tool 9ga (for example, a positional accuracy of ±1 mm is acceptable) and the height of the semiconductor chip 2 can be determined with high accuracy.

Second Embodiment

Figure 29:
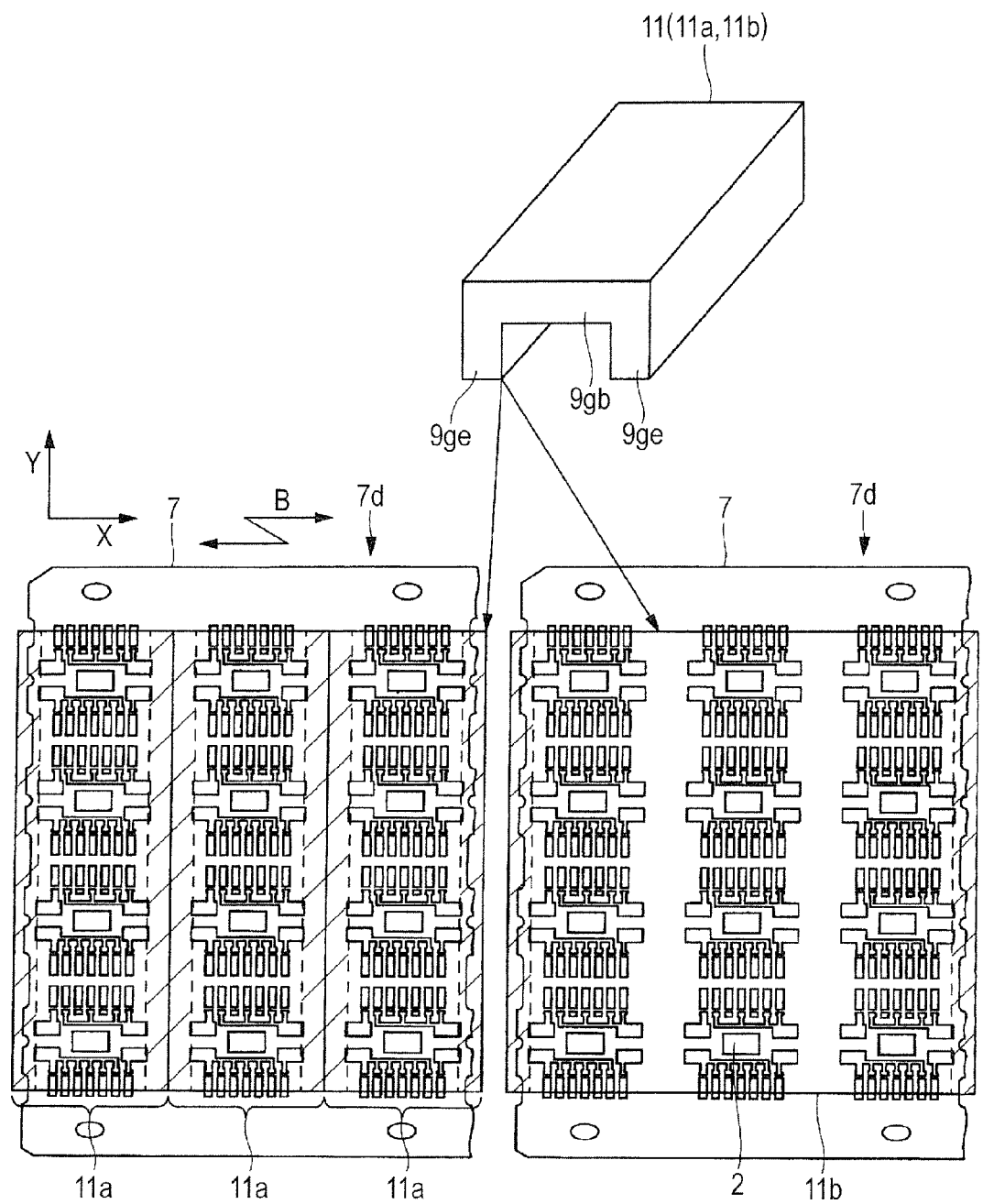
FIG. 29 is a fragmentary plan view combined with a perspective view, showing an example of the area to be pressed by a correcting tool according to a second embodiment of the invention.

FIG. 29 is a fragmentary plan view combined with a perspective view, showing an example of the area to be pressed by a correcting tool according to the second embodiment.

FIG. 29 illustrates a case that correction is performed by coating a solder paste (solder material 6 in the form of a paste) as a jointing material (die bonding material). When a solder paste is used, the die bonder 9 shown in FIG. 10 is not used and instead an assembly 7d is passed through a reflow furnace (reflow apparatus) to perform solder-bonding of the semiconductor chip 2.

First, an assembly 7d in which a semiconductor chip 2 is placed over the die pad 1c (FIG. 19) of the lead frame 7 through a solder paste is prepared. Then, like the correction process in the first embodiment as shown in FIGS. 18 and 19, while a correcting tool 11 is pressed against the main surface 2a of the semiconductor chip 2, the assembly 7d is passed through the reflow furnace to melt the solder paste. Then, the assembly 7d is taken out of the reflow furnace to let the solder paste harden, and then the correcting tool 11 is released from the semiconductor chip 2 and the semiconductor chip 2 is mounted over the die pad 1c through the hardened solder material 6.

The correcting tool 11 is the same as the correcting tool 9ga in the first embodiment. Therefore, like the correction process as shown in FIGS. 18 and 19, the solder paste is hardened while the first surface 9gc of the first part 9ga of the correcting tool 11 is pressed against the main surface 2a of the semiconductor chip 2 and the second parts 9ge of the correcting tool 11 are pressed against the lead frame 7.

When the reflow furnace is used, the correcting tool 11 may have a larger width.

For example, when the lead frame 7 has a plurality of device regions (semiconductor device formation regions) 7a arranged in a matrix pattern as shown in FIG. 5, the correcting tool 11 is simultaneously pressed against the main surfaces 2a of semiconductor chips 2 in a plurality of rows, each row including a plurality of semiconductor chips 2 arranged in the direction (Y direction) intersecting with the conveying direction B for the lead frame 7 as shown in FIG. 29.

Consequently, correction can be performed on a plurality of rows of semiconductor chips 2 at a time, so the correction speed (throughput) is substantially increased.

As shown in FIG. 29, three correcting tools 11a, each capable of performing correction on one row of semiconductor chips at a time, may be used simultaneously or a single correcting tool 11b whose width is large enough to cover three rows in the X direction may be used to perform correction on three rows at a time.

When the wide correcting tool 11b capable of performing correction on three rows in the X direction at a time is used, the correction speed is substantially increased.

On the other hand, when the three correcting tools 11a each capable of performing correction on a single row of semiconductor chips 2 at a time is used to perform correction on three rows in the X direction, warp of the tool itself is smaller and thus correction accuracy is higher.

The invention made by the present inventors has been so far explained concretely in reference to the preferred embodiments thereof. However, the invention is not limited thereto and it is obvious that these details may be modified in various ways without departing from the gist thereof.

For example, although in the explanation of the first and second embodiments, the jointing material (die bonding material) for fixing a semiconductor chip 2 is assumed to be a solder material 6, the jointing material may be a jointing material other than the solder material 6 provided that its properties are similar to the properties of the solder material 6.

What is claimed is:

1. A method for manufacturing a semiconductor device comprising the steps of:
    (a) coating a chip mounting area of a lead frame with a jointing material;
    (b) after the step (a), placing a semiconductor chip over the jointing material;
    (c) after the step (b), pressing a tool against an upper surface of the semiconductor chip with the jointing material in a molten state and then letting the jointing material harden; and
    (d) after the step (c), releasing the tool from the semiconductor chip and mounting the semiconductor chip over the chip mounting area through the jointing material;
    wherein the tool includes a first part having a first surface as a surface along a support surface of a support member for supporting the chip mounting area and a second part having a second surface intersecting with the first surface, and
    wherein in the step (c), while the first surface of the first part of the tool is pressed against the upper surface of the semiconductor chip and the second part of the tool is pressed against the lead frame, the jointing material is hardened.

2. The method for manufacturing a semiconductor device according to claim 1, wherein the jointing material is a solder material.

3. The method for manufacturing a semiconductor device according to claim 1, wherein in the step (c), the tool is pressed against the upper surfaces of the semiconductor chips at a time.

4. The method for manufacturing a semiconductor device according to claim 1,
    wherein a plurality of semiconductor device formation regions are arranged in a matrix pattern in the lead frame, and
    wherein in the step (c), the tool is pressed at a time against the upper surfaces of the semiconductor chips in a row which are arranged in a direction intersecting with a conveying direction for the lead frame.

5. The method for manufacturing a semiconductor device according to claim 1,
    wherein a concave is made in the first surface of the tool, and
    wherein in the step (c), an area of the first surface of the tool except the recess is pressed against the upper surface of the semiconductor chip.

6. The method for manufacturing a semiconductor device according to claim 1, wherein height of the second surface of the second part of the tool in a pressing direction is equal to a sum of thickness of the semiconductor chip and thickness of the jointing material after assembling of the semiconductor device.

7. The method for manufacturing a semiconductor device according to claim 1, wherein in the step (c), the second part of the tool is pressed against an outer portion of a semiconductor device formation region in the lead frame.

8. The method for manufacturing a semiconductor device according to claim 1, wherein in the step (c), the tool is pressed against the semiconductor chip when the jointing material in a molten state has a higher temperature than a solid phase temperature of the jointing material.

9. The method for manufacturing a semiconductor device according to claim 8, wherein in the step (c), the tool is held pressed against the semiconductor chip until the temperature of the jointing material becomes lower than the sold phase temperature, and then the tool is released from the semiconductor chip.

10. The method for manufacturing a semiconductor device according to claim 1,
wherein a cooling unit for cooling the tool is coupled to the tool.

11. A method for manufacturing a semiconductor device comprising the steps of:
(a) providing an assembly with a semiconductor chip placed over a chip mounting area of a lead frame through a solder paste;
(b) after the step (a), passing the assembly through a reflow furnace with a tool pressed against an upper surface of the semiconductor chip to melt the solder paste;
(c) after the step (b), taking the assembly out of the reflow furnace and letting the solder paste harden; and
(d) after the step (c), releasing the tool from the semiconductor chip and mounting the semiconductor chip over the chip mounting area through a solder material,
wherein the tool includes a first part having a first surface as a surface along a support surface of a support member for supporting the chip mounting area and a second part having a second surface intersecting with the first surface, and
wherein in the step (b), while the first surface of the first part of the tool is pressed against the upper surface of the semiconductor chip and the second part of the tool is pressed against the lead frame, the solder paste is hardened.

12. The method for manufacturing a semiconductor device according to claim 11,
wherein a plurality of semiconductor device formation regions are arranged in a matrix pattern in the lead frame, and
wherein in the step (b), the tool is pressed at a time against the upper surfaces of the semiconductor chips in a plurality of rows, each row including the semiconductor chips arranged in a direction intersecting with a conveying direction for the lead frame.

* * * * *